United States Patent [19]

Borgen et al.

[11] Patent Number: 5,530,443
[45] Date of Patent: Jun. 25, 1996

[54] DIGITAL CIRCUIT FOR THE INTRODUCTION OF DITHER INTO AN ANALOG SIGNAL

[75] Inventors: Gary S. Borgen, Camarillo; Christian L. Houlberg, Ventura, both of Calif.

[73] Assignee: The United States of America as represented by the Secretary of the Navy, Washington, D.C.

[21] Appl. No.: 300,504

[22] Filed: Sep. 2, 1994

Related U.S. Application Data

[63] Continuation-in-part of Ser. No. 233,283, Apr. 25, 1994.
[51] Int. Cl.[6] ................................................... H03M 1/20
[52] U.S. Cl. ................................................. 341/131; 341/139
[58] Field of Search ................................. 341/131, 118, 341/155, 139

[56] References Cited

U.S. PATENT DOCUMENTS 5,189,418  2/1993  Bartz et al. .......................... 341/131
5,493,298  2/1996  Bartz .................................... 341/131

Primary Examiner—Brian K. Young
Attorney, Agent, or Firm—David Kalmbaugh; Melvin Sliwka

[57] ABSTRACT

An electronics circuit for accurately digitizing an analog audio, video or like data signal into a fourteen bit digital equivalent signal/words having thirteen data bits and a sign bit and then introducing a dither component into the digital equivalent signal. The circuit includes a first Electrical Erasable Programmed Read Only Memory which generates a dither component to be added to a selected, five, six, seven or eight bits of each fourteen bit digital equivalent sample. The circuit also includes an automatic gain control circuit and a data selector circuit which, in combination, select the five, six, seven or eight data bits of the thirteen data bits of each digital equivalent sample to supply to a binary adder. The binary adder then adds the dither component to the selected data bits of each digital equivalent sample. The five, six, seven or eight selected bits of each fourteen bit sample provide optimum video, audio or like information for the sample.

20 Claims, 15 Drawing Sheets

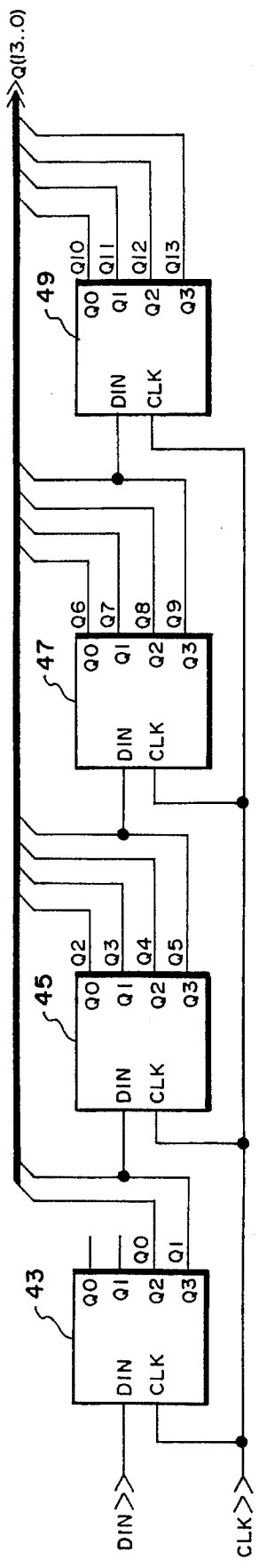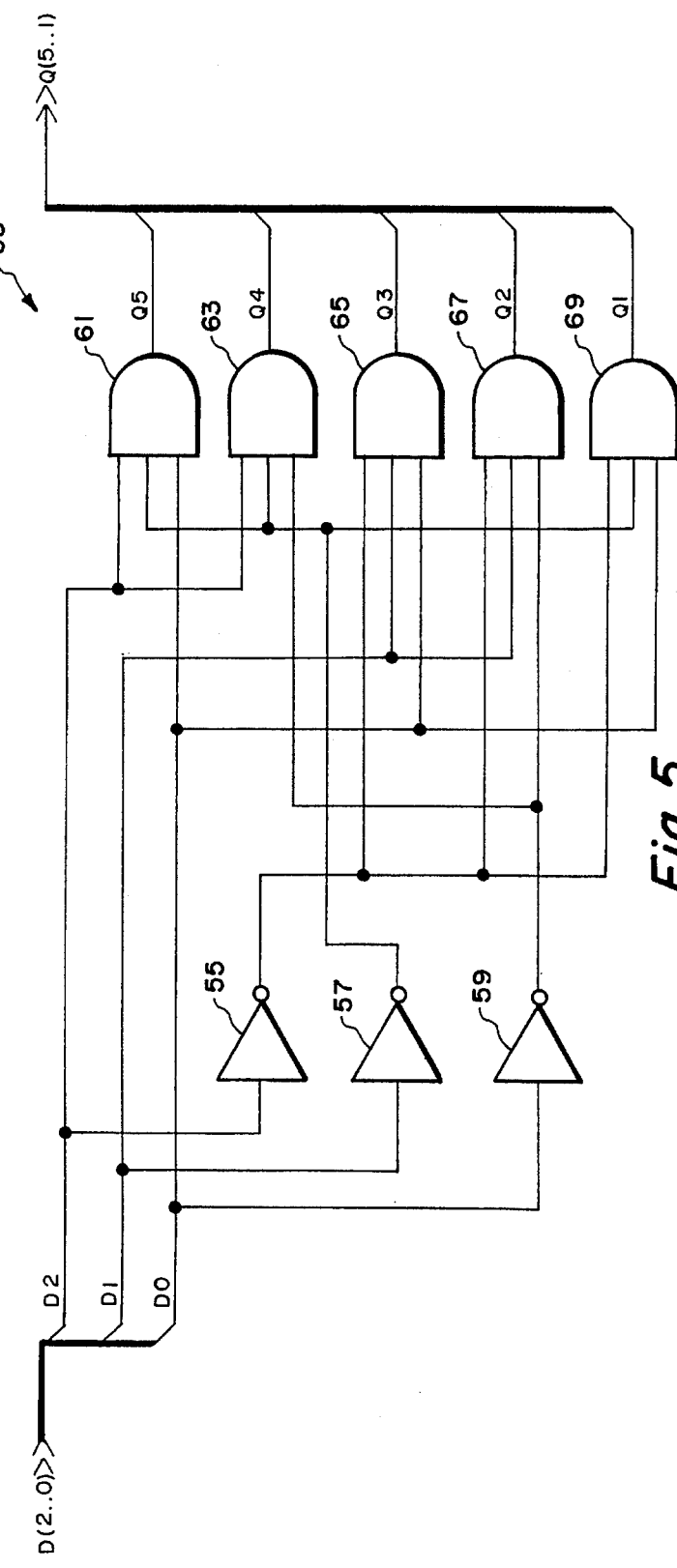
Fig. 4.
Fig. 5.

DIGITAL CIRCUIT FOR THE INTRODUCTION OF DITHER INTO AN ANALOG SIGNAL

This application is a continuation-in-part of U.S. patent application Ser. No. 08/233,283, filed Apr. 25, 1994.

BACKGROUND OF THE INVENTION

1. Field of the Invention

The present invention relates generally to the conversion of electric signals from analog to digital form. More specifically, the present invention relates to a digital circuit for translating an analog video or like analog signal into an equivalent digital signal with the addition of dither which is an artificially created noise signal and which provides for a reduction of noise and distortion in the signal.

2. Description of the Prior Art

The pulse code modulation (PCM) or digital processing of analog audio signals has become, or is becoming, the mainstream of high fidelity sound recording and reproduction with the advent and ever increasing commercial acceptance of compact discs. The digital processing of analog signals in the low to high frequency range is also becoming highly useful for analyzing the performance of weapons systems such as guided missiles. For example, the analog data acquired by a guided missile during flight is converted to its digital equivalent and then placed in a digital PCM frame for transmission to a ground station for analysis.

There are, however, some problems left unsolved in the art of digital processing of analog signals. For example, there is a significant difference between the samples of an analog signal and the quantized values of the samples which is generally referred to as "quantization noise". This difference becomes particularly pronounced when the input analog signal is low and there are only a small number of quantization steps, thereby, for example, distorting reproduced sound as higher harmonics in high fidelity sound systems. Even when an input analog audio or like signal level is high, the quantization noise will distort the signal if it changes slowly.

A prior art solution to this quantization noise problem has been the use of dither which is intended to turn the quantization noise into broad band white noise which has little or no effect on reproduced sound or like analog signals and which is generally referred to as "white noise". An analog dither signal is superposed on the analog audio or like signal prior to its digitization and may, or may not be removed from the digitized audio signal.

One system of the prior art adds an analog dither signal, converted from the output from a digital dither generator by a digital to analog converter, to the incoming analog audio or analog data signal. The combined analog data and dither is digitized by an analog to digital converter and then fed to a subtractor circuit. The subtractor circuit is also supplied the digital dither directly from the dither generator. The subtractor circuit then subtracts the dither component from the digital data and dither signal.

A second system of the prior art uses an analog dither generator in combination with a second analog to digital converter for digitizing the analog dither prior to its delivery to the subtractor. In this prior art system, analog dither is added directly to the analog data signal. The resulting dither added data signal is then digitized by the first analog to digital converter and the analog dither is digitized by the second analog to digital converter preparatory to application to the two inputs of the subtractor circuit.

During the conversion process from an analog signal to its digital equivalent, prior art systems often use from as little as three digital bits to one digital bit to represent the incoming analog signal. However, in certain applications, such as data received from a missile during flight, there is a need to increase the resolution of the equivalent digital signal provided by the missile's telemetry system. This necessitates the use of, for example, fourteen bit equivalent digital words to represent the incoming analog signal. This increase in the number of bits to represent the incoming analog signal results in a significant decrease in the error being introduced in the higher resolution bits (least significant bits) and a significant increase in the bandwidth required for transmission of the digital equivalent signal provided by the missile's telemetry system. By utilizing a form of automatic gain control (AGC) after the incoming analog signal is converted to its digital fourteen bit equivalent, a subset, for example, of eight of the fourteen bits may be transmitted with a significant increase in the accuracy and resolution of the transmitted digital information within a reduced bandwidth.

In view of the foregoing, it is an object of the present invention to provide an electronics circuit for accurately converting an analog audio or like data signal into its digital equivalent.

It is a further object of the present invention to provide a reliable yet relatively simplistic and inexpensive electronics circuitry for converting an analog audio or like data signal into its digital equivalent.

It is yet a further object of the present invention to provide electronics circuitry which is capable of operation with high resolution and conversion accuracy.

It is still a further object of the present invention to provide electronics circuitry which is capable of operation with a minimum bandwidth.

The above and other novel features and advantages of the present invention and the manner of realizing them will become more apparent and the invention will be best understood from a study of the following description and appended claims, with reference to the attached drawings.

SUMMARY OF THE INVENTION

According to the present invention, briefly stated, there is provided an electronics circuit for accurately digitizing an analog audio, video or like data signal into a fourteen bit digital equivalent signal, extracting a set of information bits, and then introducing a dither component into the digital equivalent signal. The fourteen bit digital equivalent signal/word includes thirteen data bits and a sign bit which indicates whether the digital equivalent signal is positive or negative.

The electronics circuit of the present invention includes a first Electrical Erasable Programmed Read Only Memory which generates a dither component to be added to a selected, five, six, seven or eight bits of each fourteen bit digital equivalent sample. The circuit also includes a doppler video processing circuit which has an automatic gain control circuit and a data selector circuit which, in combination, select the five, six, seven or eight data bits of the thirteen data bits of each digital equivalent sample to supply to a binary adder. A second Electrical Erasable Programmed Read Only Memory provides a two bit digital signal to the data selector circuit. This two bit signal along with a seven bit gain signal from the automatic gain control circuit is used by the data selector circuit to select the five, six, seven or eight data bits of the thirteen data bits of each digital equivalent sample to supply to the binary adder.

The binary adder then adds the dither component to the selected data bits of each digital equivalent sample. The five, six, seven or eight selected bits of each fourteen bit sample provide optimum video, audio or like information for the sample.

BRIEF DESCRIPTION OF THE DRAWINGS

FIG. 4 is a detailed logic circuit diagram of the fourteen bit serial to parallel converter of the circuit of FIG. 2;

FIG. 5 is a detailed logic diagrams of the three to eight decoder of the circuit of FIG. 2;

DETAILED DESCRIPTION OF THE PREFERRED EMBODIMENT

Figure 1:
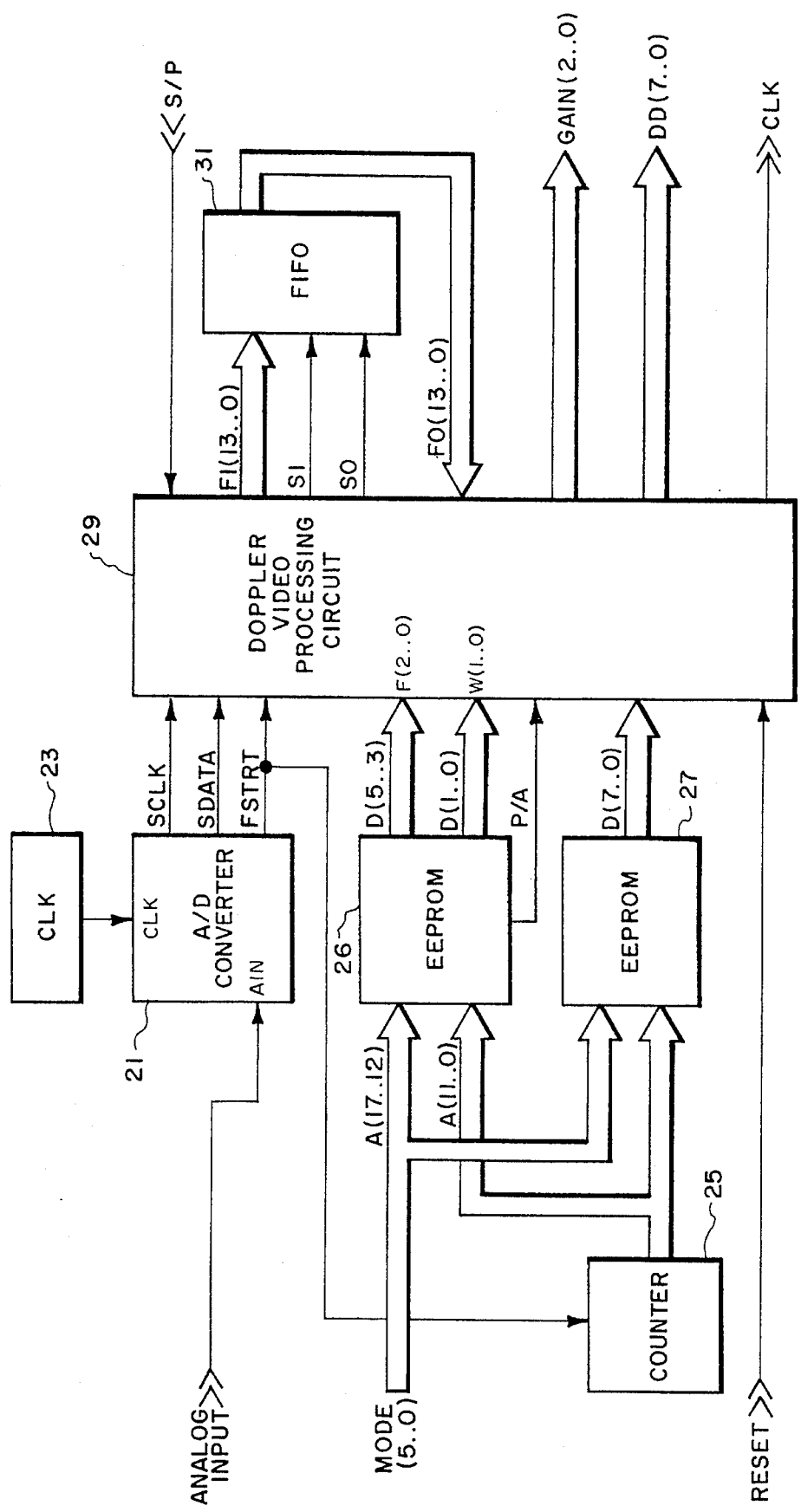
FIG. 1 is a block diagram of the digital circuit for the introduction of dither into an analog video or like signal constituting the present invention.

Referring to FIG. 1 an analog video or like data signal is supplied to the analog data input (AIN input) of an analog to digital converter 21 which converts the analog data signal to an equivalent fourteen bit digital signal. A clock signal generator 23 supplies a five megahertz system clock signal to the clock input (CLK input) of analog to digital converter 21 with the five megahertz system clock signal being provided to analog to digital converter 21 to allow converter 21 to convert the analog data signal to the equivalent fourteen bit digital signal. This equivalent fourteen bit digital signal is next supplied to the serial data (SDATA input) of doppler video processing circuit 29.

The analog to digital converter 21 also supplies an FSTRT signal (illustrated in FIG. 3) to the synchronous binary counter 25 which, in response to the FSTRT signal, provides addressing to an Electrical Erasable Programmed Read Only Memory (EEPROM) 27 which functions as a dither generator. Dither generator 27, in turn, provides an eight bit dither signal/word (white noise) to a doppler video processing circuit 29. Counter 25 also provides addressing to an Electrical Erasable Programmed Read Only Memory (EEPROM) 26 which provides a one bit logic signal through the P/A input of circuit 29 to the P/A input of a gain circuit 71, a three bit logic signal through the F(2..0) input of circuit 29 to the D(2..0) input of a three bit to eight bit decoder 53 and a two bit logic signal through the W(1..0) input of circuit 29 to the W(1..0) input of a data selector circuit 112.

Logic signals provided via the MODE(5..0) input lines to EEPROM 26 determine certain output signals which occur at D7, D6–D3, D2, and D1–D0 outputs of EEPROM 26. The signals provided via the MODE(5..0) input lines to EEPROM 26 are missile generated signals. For example, when the missile approaches a target it may be desirable to change from average to peak detection. Certain signals supplied by the missile via the MODE(5..0) input lines to EEPROM 26 will effect this change causing the D2 output of EEPROM 26 to change from the logic zero state to the logic one state.

The analog to digital converter 21 used in the preferred embodiment of the present invention is a Model MAX121 BiCMOS serial-output, sampling 14-bit analog-to-digital converter manufactured by MAXIM Integrated Products of Sunnyvale, Calif.

Figure 2:
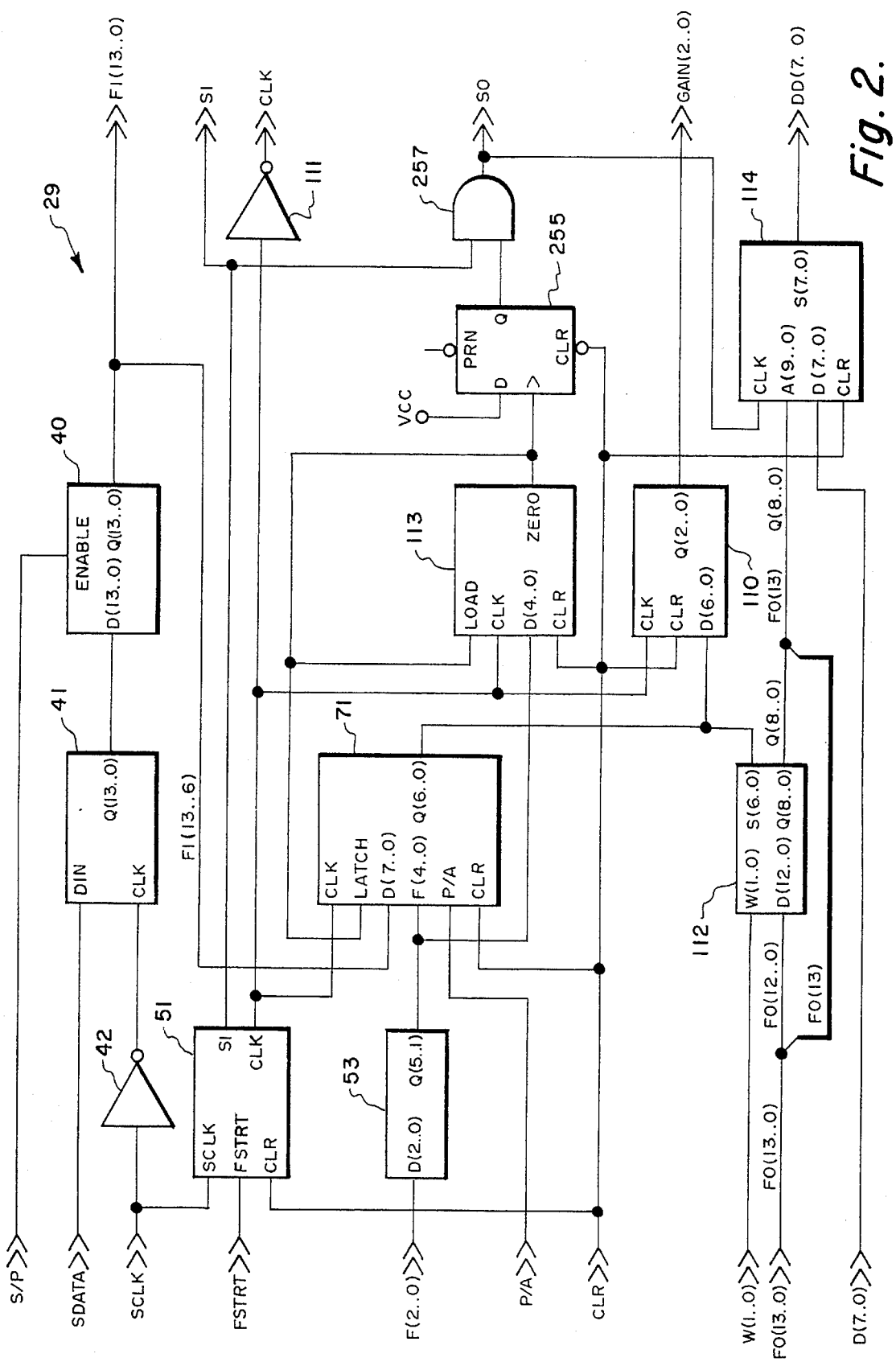
FIG. 2 is a block diagram of the video doppler processing circuit of FIG. 1.
Figure 3:
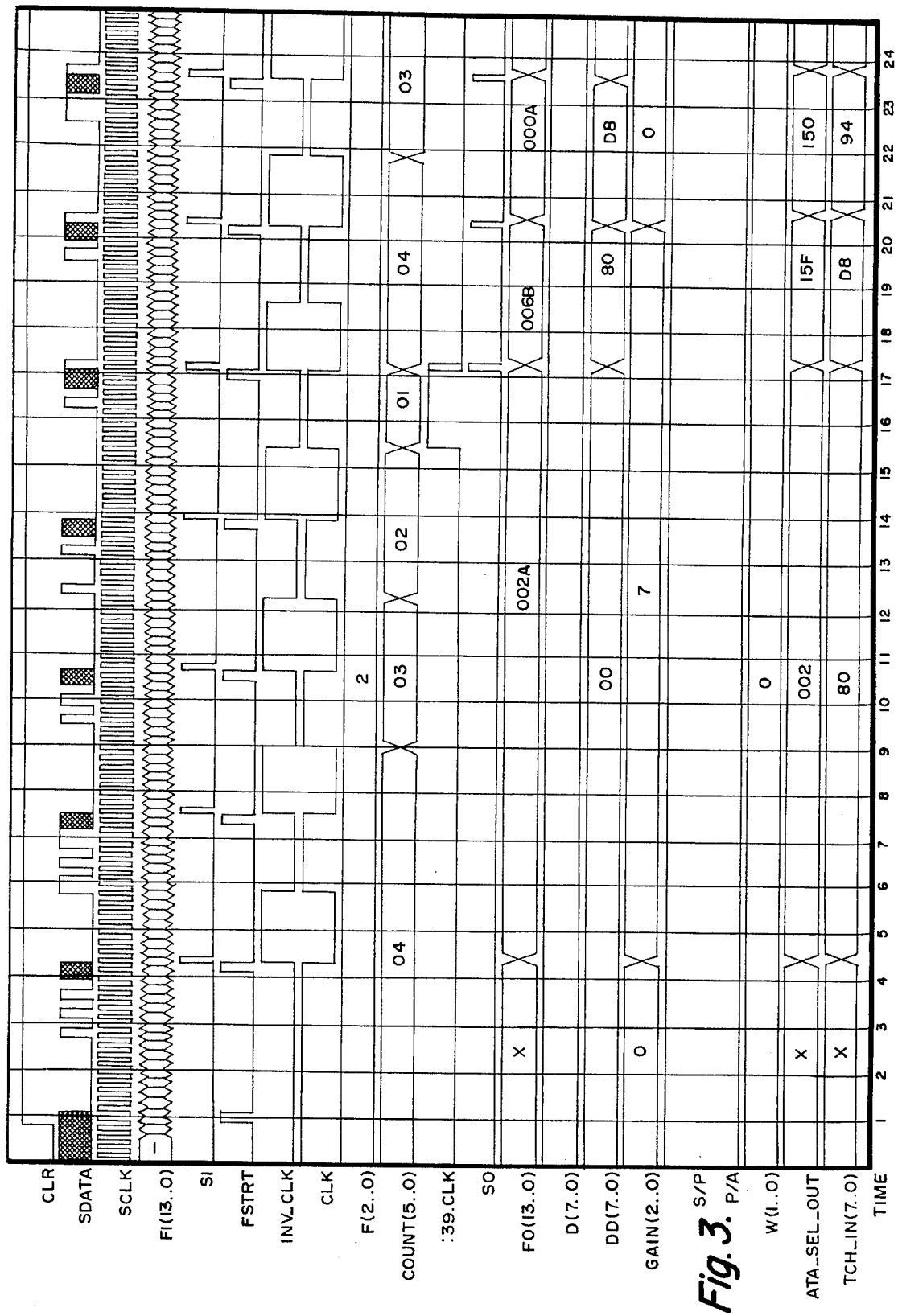
FIG. 3 is a timing diagram illustrating some of the waveforms occurring at the inputs and outputs of the circuit of FIG. 2.
Figure 6:
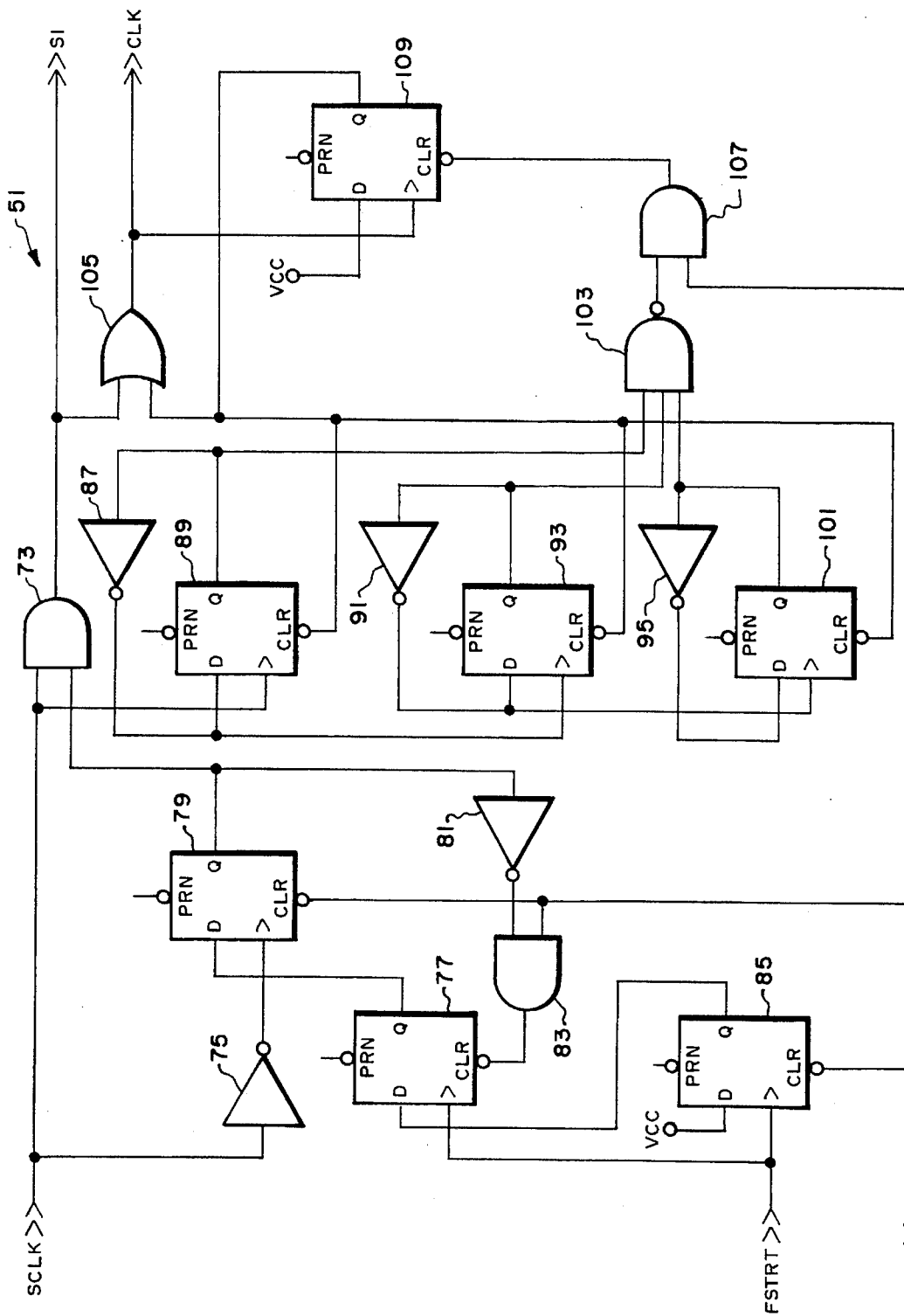
FIG. 6 is a detailed logic diagram of the clock generating circuit of the circuit of FIG. 2.
Figure 7A:
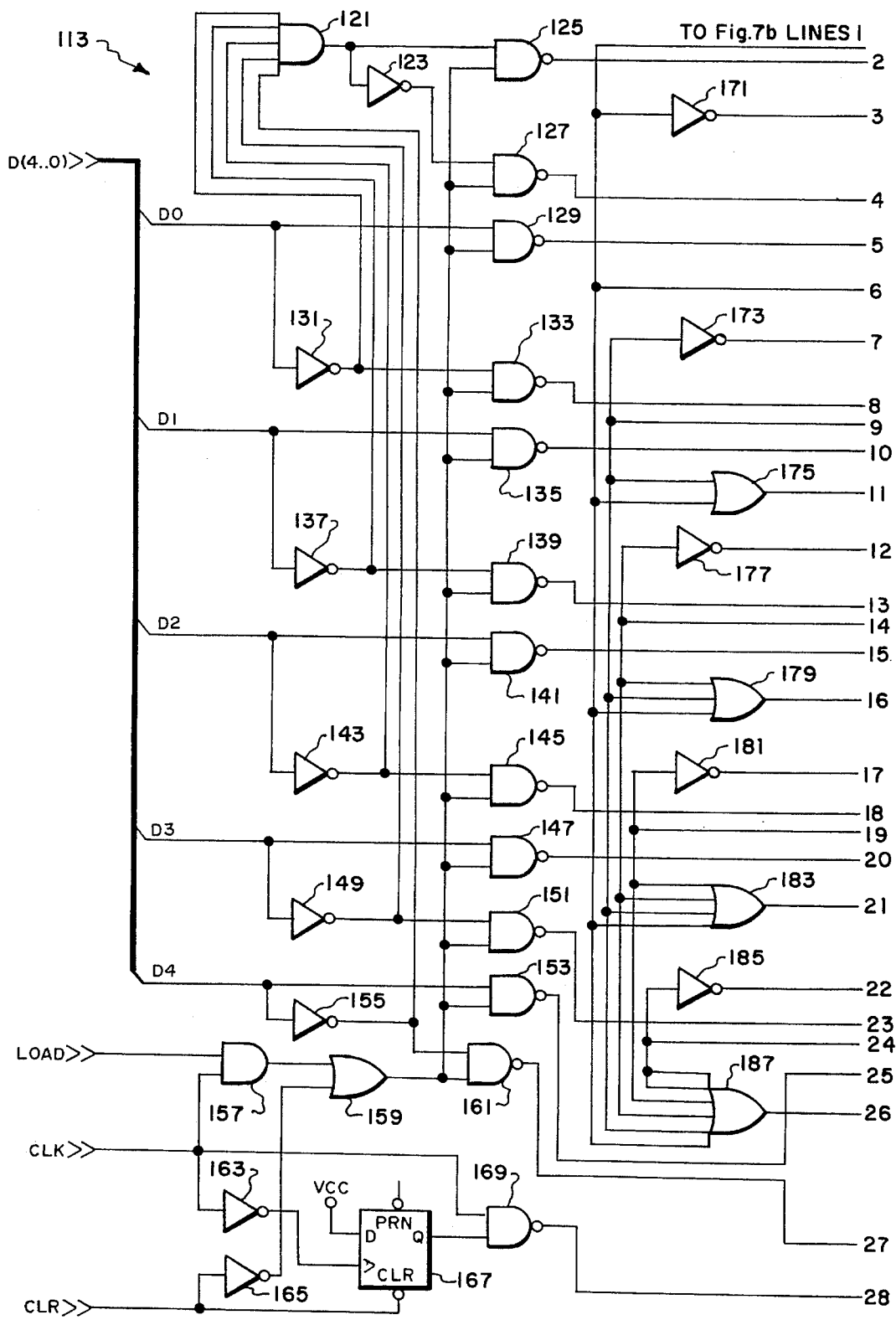
FIGS. 7a and 7b is a detailed logic diagram of the down counter of the circuit of FIG. 2.
Figure 7B:
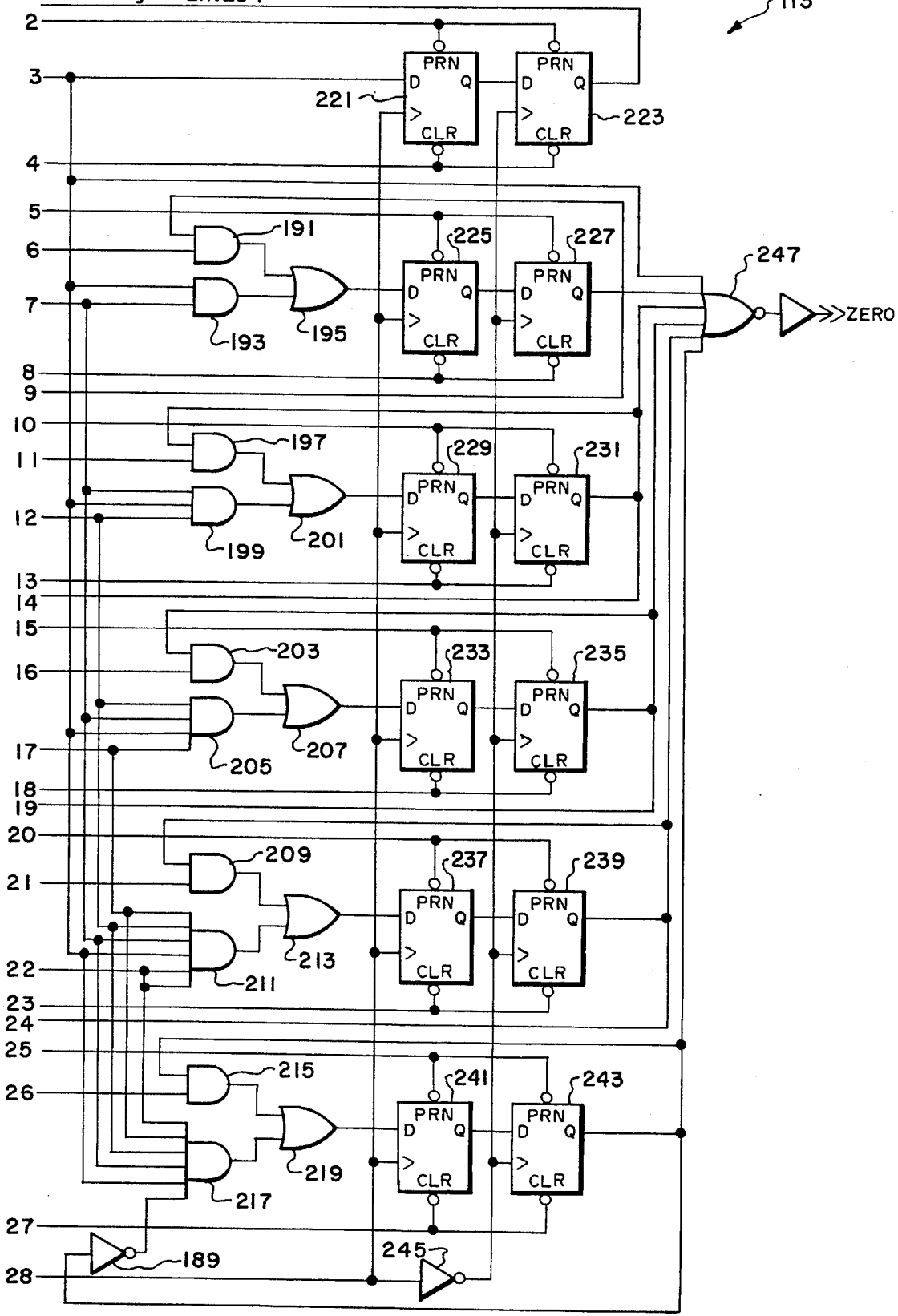
Figure 8:
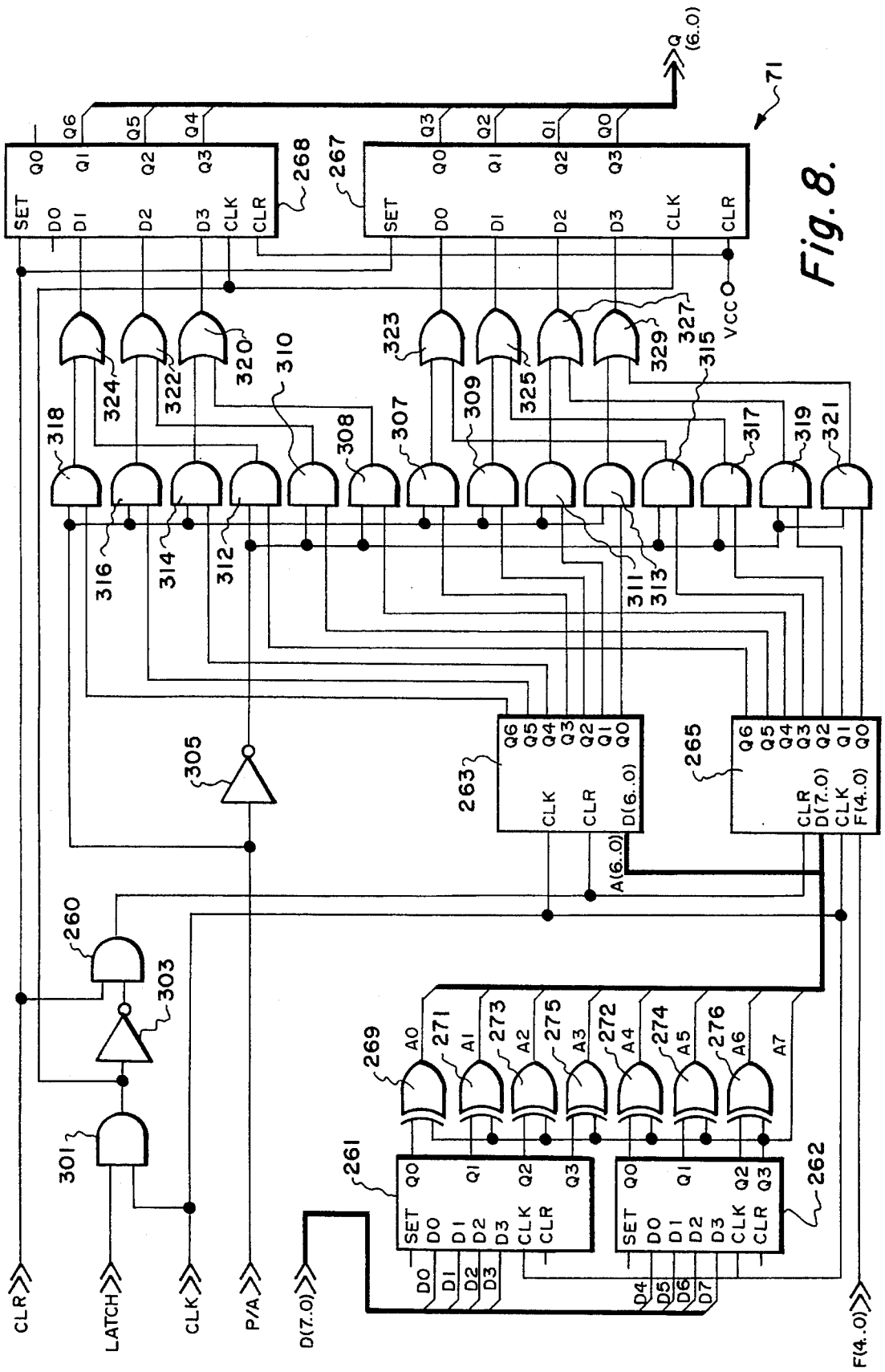
FIG. 8 is a detailed logic diagram of the gain circuit of the circuit of FIG. 2.
Figure 9:
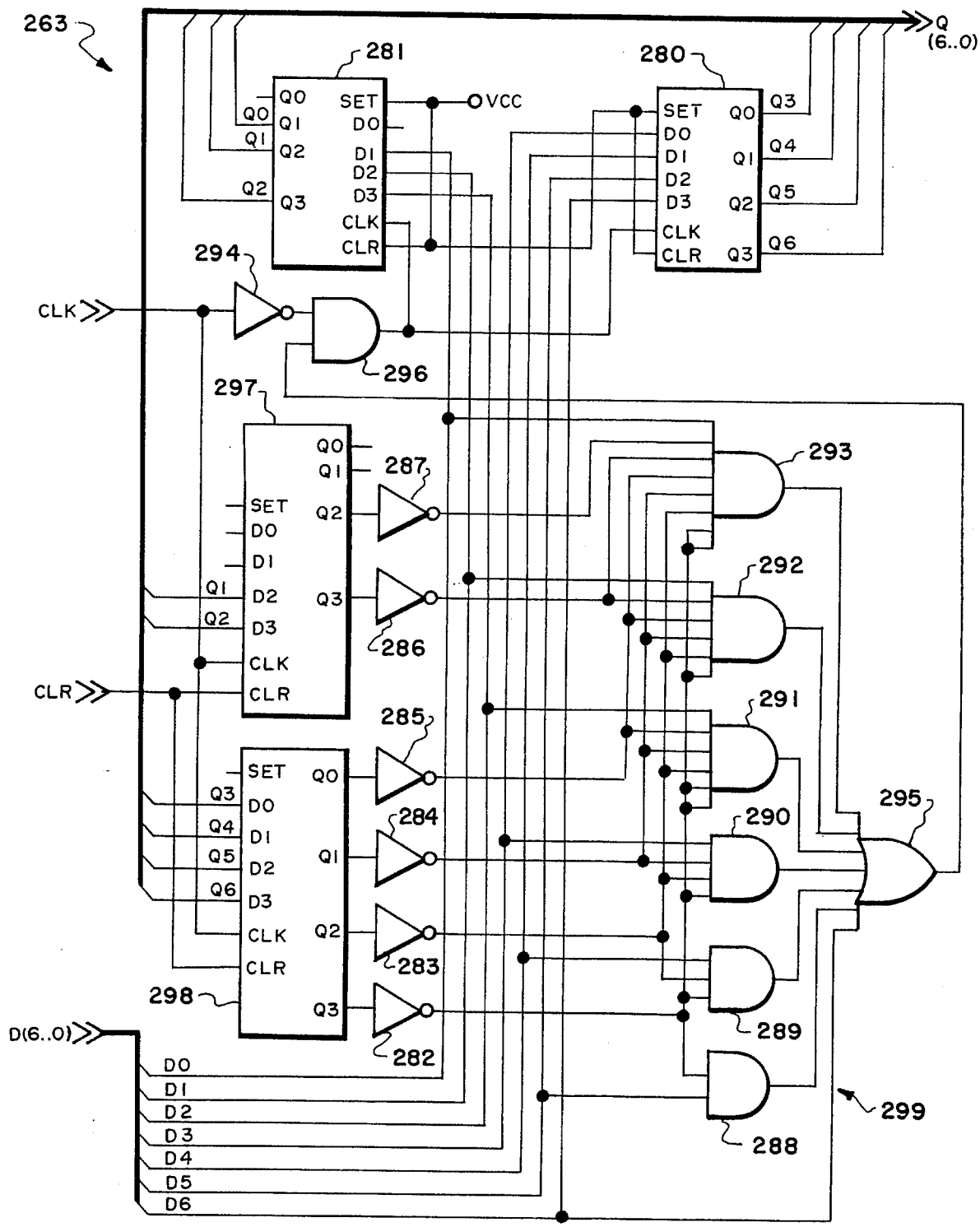
FIG. 9 is a detailed logic diagram of the peak detector circuit of the circuit of FIG. 8.
Figure 10:
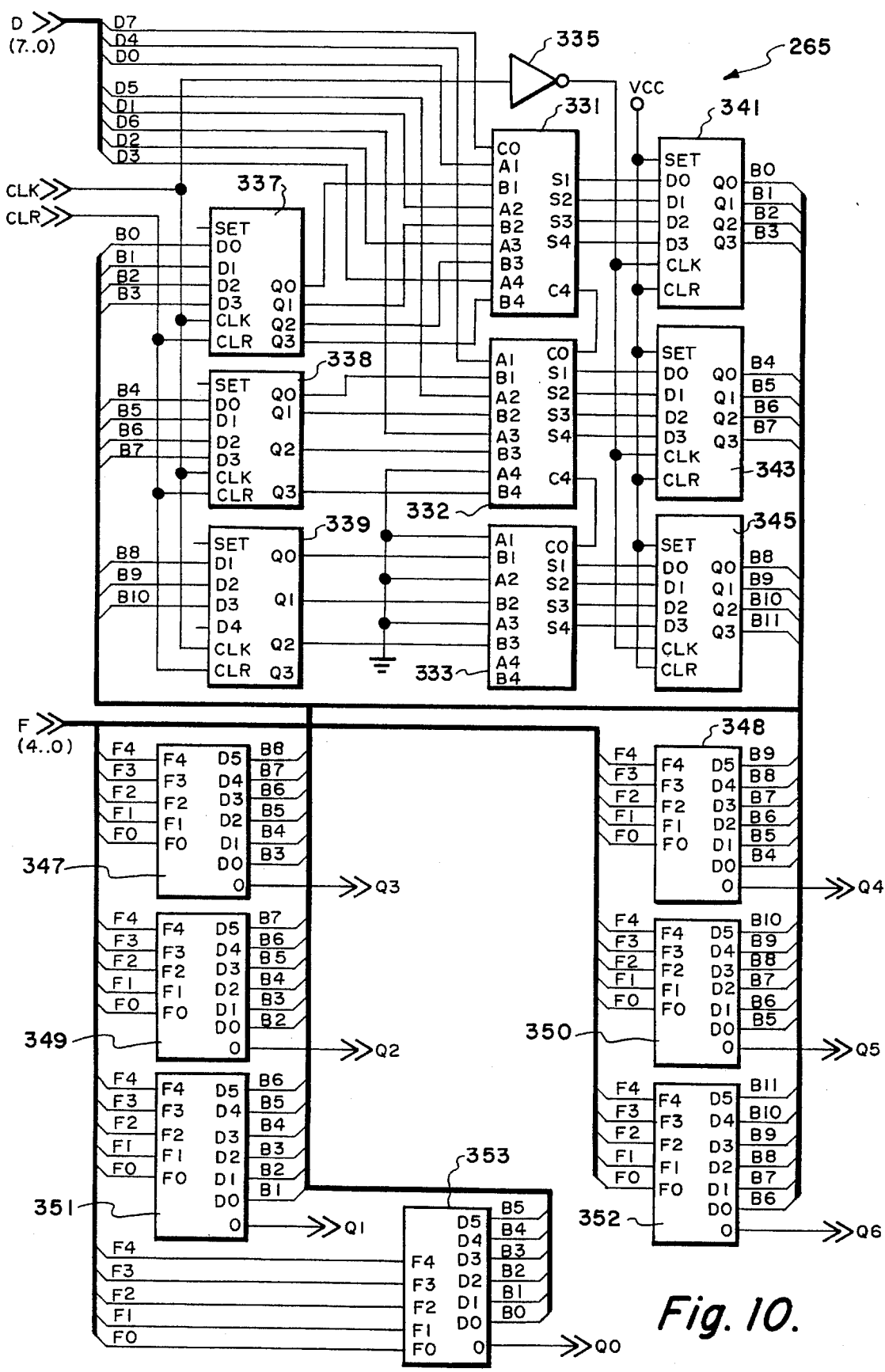
FIG. 10 is a detailed logic diagram of the averaging circuit of the circuit of FIG. 8.
Figure 11:
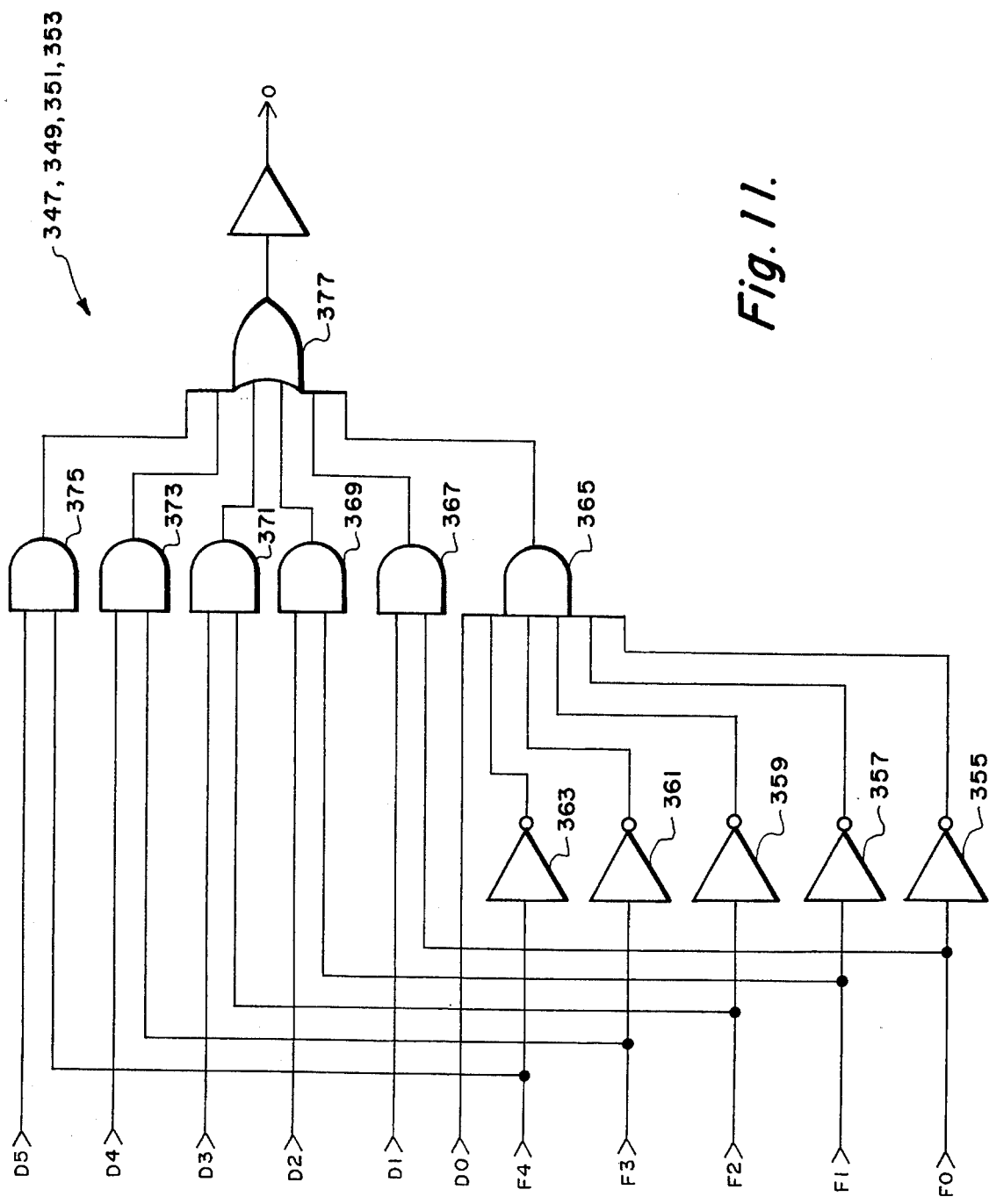
FIG. 11 is a detailed logic diagram of the filter select circuits of the circuit of FIG. 10.
Figure 12:
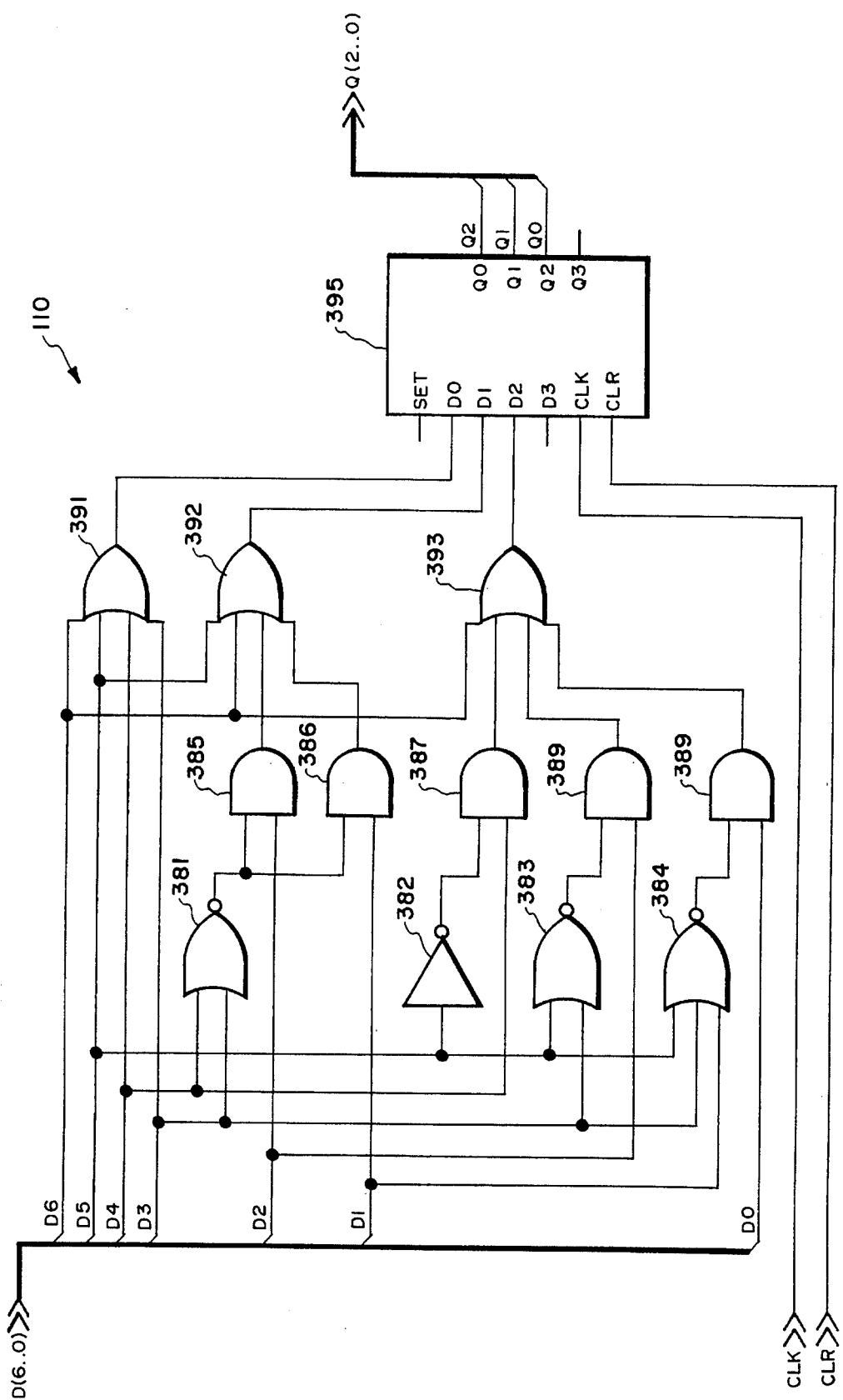
FIG. 12 is a detailed logic diagram of the gain encoder of the circuit of FIG. 2.

Referring to FIGS. 1, 2, 3, and 4, doppler video processing circuit 29 receives from analog to digital converter 21 the fourteen bit digital equivalent signal (identified as the SDATA signal of FIG. 3). This fourteen bit digital equivalent signal is supplied to the data input of a fourteen bit serial to parallel shift register 41 which comprises four 4 bit serial to parallel shift registers 43, 45, 47 and 49. Each shift register 43, 45, 47 and 49 is of well known design and may, for example, include four serially connected D type flip-flops, not illustrated. The clock signal used to convert the fourteen bit digital equivalent signal from a serial to a parallel format is the five megahertz system clock signal which is illustrated in FIG. 3 as SCLK.

Doppler video processing circuit 29 can accept digital data in either a parallel format or a serial format. Doppler video processing circuit includes a tristate buffer 40 which is enabled by a logic one being supplied through S/P input of circuit 29 to the ENABLE input of tristate buffer 40. This allows the parallel fourteen bit equivalent words from serial to parallel converter 41 to pass through tristate buffer 40.

When circuit 29 is to receive data in a parallel format a logic zero is supplied through the P/A input of circuit 29 to the enable input of tristate buffer 41 disabling tristate buffer 41. Fourteen bit parallel data words to circuit 29 are then supplied through the FI(13..0) input of circuit 29. By allowing data to be provided directly to circuit 29 in a parallel format, data may be processed using a system clock signal that is substantially faster than the five megahertz clock signal supplied to circuit 29 by clock signal generator 23 via analog to digital converter 21.

For the purpose of illustrating the operation of circuit 29, it is to be understood that analog to digital converter 21 is to supply data to circuit 29 in a serial format.

It should be noted at this time that analog to digital converter 21 also provides the FSTRT signal of FIG. 3 which indicates that analog to digital converter 21 is converting a sample of the incoming analog video or like data signal to its fourteen bit digital equivalent signal. It should also be noted that converter 21 provides data in sixteen bit intervals/ words with the additional two bits being required to allow converter 21 to set up for conversion of a succeeding sample of the incoming analog video or like data signal.

The parallel fourteen bit equivalent words from serial to parallel converter 41 are supplied to a synchronous first-in first-out memory 31. The SI signal of FIG. 3, which is generated by circuit 29, strobes the fourteen bit equivalent words of FIG. 3 into first-in first-out memory 31, while the SO signal of FIG. 3, which is also generated by circuit 29, strobes the fourteen bit equivalent words of FIG. 3 out of first-in first out memory 31 on a first in first out basis.

As is best illustrated by the waveforms of FIG. 3, the first fourteen bit digital word stored in memory 31 by the SI signal of FIG. 3 is hexadecimal 002A. This hexadecimal 002A equivalent signal, FIG. 3, is then retrieved from memory 31 and provided to the FO(13...0) input of circuit 29. The second SI pulse of FIG. 3 results in a hexadecimal 006B equivalent signal being stored in memory 31. This hexadecimal 006B equivalent signal, FIG. 3, is next retrieved from memory 31 by the second S0 pulse of FIG. 3 and then provided to FO(13...0) input of circuit 29. The third SI pulse of FIG. 3 results in a hexadecimal 000A equivalent signal being stored within memory 31. This hexadecimal 000A equivalent signal, FIG. 3, is next retrieved from memory 31 by the third S0 pulse of FIG. 3 and then provided to FO(13...0) input of circuit 29.

The synchronous first-in first-out memory 31 used comprises four cascadeable 64×4 bit word asynchronous first-in, first-out memories, Model No. CY7C404 manufactured by Cypress Semiconductor of San Jose, Calif.

Referring to FIGS. 1, 2, 3 and 5, there is provided by EEPROM 26 a three bit word which is supplied through the F(2..0) inputs of circuit 29 to the D(2..0) input of a three bit to eight bit decoder 53. For the timing waveforms illustrated by FIG. 3, the F(2..0) signal indicates that a three bit word which is 0,1,0 (hexadecimal 2) is being supplied to decoder 53. This results in logic zeros being supplied to the inputs of inverters 55 and 59 and a logic one being supplied to the input of inverter 57. The outputs of inverters 55 and 59 will transition to the logic one state resulting in logic ones at the first, second and third inputs of AND gate 67 thereby causing the output of AND gate 67 to transition to the logic one state. The logic one occurring at the output of AND gate 67 and the logic zeros occurring at the outputs of AND gates 61, 63, 65 and 69 are next supplied to the F(4..0) inputs of a gain circuit 71 and the D(4..0) inputs of a down counter 113.

It should be noted that the three bit word supplied to decoder 53 determines the time delay between the SI signal of FIG. 3 and the SO signal of FIG. 3 which for the timing waveforms of FIG. 3 is about thirteen microseconds. Thus, as is best illustrated by FIG. 3 four fourteen bit words (SDATA of FIG. 3) are stored in memory 31 prior to the first stored fourteen bit word being retrieved from memory 31 as a result of the occurrence of the first SO pulse of FIG. 3.

Referring now to FIG. 1, 2, 3 and 6, there is shown a clock generating circuit 51 which receives the five megahertz system clock signal of FIG. 3 from analog to digital converter 21 as well as the FSTRT signal of FIG. 3 and a CLR signal, FIG. 3, which is provided by the missile's telemetry system. As shown in FIG. 3, a logic zero CLR pulse is supplied to the CLR input of clock generating circuit 51 clearing Flip-Flops 77, 79, 85, 89, 93, 101 and 109 which results in logic zeros at the Q outputs of these Flip-Flops.

The five megahertz system clock signal (SCLK, FIG. 3) is supplied to the SCLK input of clock generating circuit 51 and then inverted by an inverter 75 resulting in an inverted system clock signal being provided to the clock input of Flip-Flop 79. The first FSTRT pulse of the FSTRT signal of FIG. 3 occurring after the CLR signal transitions to the logic one state will cause the logic one at the D input of Flip-Flop 85 to be clocked to its Q output. This logic one is supplied to the D input of Flip-Flop 77 and then clocked through Flip-Flop 77 to its Q output by the next FSTRT pulse of the FSTRT signal of FIG. 3. This logic one is supplied to the D input of Flip-Flop 79 and then clocked through Flip-Flop 79 to its Q output by the inverted system clock signal resulting in logic one at the first input of an AND gate 73 and the input of an inverter 81. The logic one at the first input of AND gate 73 enables AND gate 73 allowing a single clock pulse of the system clock signal of FIG. 3 to pass through AND gate 73 to the SI output of clock generating circuit 51 resulting in the first SI pulse of the SI signal of FIG. 3.

Inverter 81 inverts the logic one at its input to a logic zero which passes through AND gate 83 to the clear input of Flip-Flop 77 clearing the Q output of Flip-Flop 77 to the logic zero state. This logic zero is supplied from the Q output of Flip-Flop 77 to the D input of Flip-Flop 79 and then clocked through Flip-Flop 79 to the first input AND gate 73 disabling AND gate 73.

Another FSTRT pulse when provided to the clock input of Flip-Flop 77 clocks the logic one at the D input of Flip-Flop 77 to the D input of Flip-Flop 79. The inverted system clock signal of FIG. 3 will next clock the logic one at the D input of Flip-Flop 79 to the first input of AND gate 73 again enabling AND gate 73 allowing another clock pulse of the system clock signal to pass through AND gate 73 to the SI output of circuit 51 resulting in a second SI pulse of the SI signal of FIG. 3. Successive SI pulses of the SI signal of the FIG. 3 are provided in exactly the same manner.

The SI pulse of the SI signal of FIG. 3 is provided to the first input of an OR gate 105 causing the output of OR gate 105 to transition from the logic zero state to the logic one state. The SI pulse of the SI signal of FIG. 3 is also supplied through OR gate 105 to the clock input of a Flip-Flop 109 clocking the logic one at the D input of Flip-Flop 109 to its Q output and then to the second input of OR gate 105 so that the output of OR gate 105 remains at the logic one state even though the SI signal of FIG. 3 transitions to the logic zero state.

The logic one at the Q output of Flip-Flop 109 is supplied to the clear inputs of Flip-Flops 89, 93 and 101. The system clock signal of FIG. 3 then toggles Flip-Flop 89 which toggles Flip-Flip 93 which toggles Flip-Flip 101 until the Q outputs of Flip-Flops 89, 93 and 101 are each at the logic one state resulting in logic ones being provided to each input of NAND gate 103. The output of NAND gate 103 will transition to the logic zero state causing Flip-Flip 109 to be reset such that the Q output of Flip-Flop 109 will transition to the logic zero state. This logic zero is supplied to the second input of OR gate 105 causing its output to transition to the logic zero state and remain at the logic zero state until another SI pulse of the SI signal of FIG. 3 is supplied to the clock input of Flip-Flop 109. The logic zero at the Q output of Flip-Flop 109 is also supplied to the clear inputs of Flip-Flops 89, 93 and 101 clearing these Flip-Flops which results in a logic one at the output of NAND gate 103 which is supplied to the clear input of Flip-Flop 109.

It should be noted Flip-Flops 89, 93 and 101 are configured to function as a three bit binary counter with each Q output being at the logic one state after a count of eight, that is eight pulses of the system clock signal of FIG. 3.

The signal occurring at the output of OR gate 105 is supplied through the CLK output of circuit 51 to the input of an inverter 111 which inverts the signal resulting in the CLK signal of FIG. 3.

Referring to FIGS. 1, 2, 3, 7a and 7b, when the CLR signal of FIG. 3 is at the logic zero state, Flip-Flop 167 is cleared resulting in a logic zero at the Q output of Flip-Flop 167 disabling AND gate 169. The logic zero occurring at the CLR input of down counter 113 is also supplied to an inverter 165 which inverts the logic zero to a logic one which is next supplied through a OR gate 159 to the first inputs of NAND gates 161, 153, 151, 147, 145, 141, 139, 135, 133, 129, 127 and 125 enabling NAND gates 161, 153, 151, 149, 147, 145, 139, 135, 133, 129, 127 and 125. For the timing waveforms illustrated by FIG. 3, three bit to eight bit decoder 53 provides logic zeros to the D0, D2, D3 and D4 inputs of down counter 113 and a logic one to the D1 input of down counter 113.

Since the D4 input of down counter 113 is at the logic zero state the logic one occurring at the output of inverter 155 will be supplied to the second input of NAND gate 161 resulting in a logic zero at the output of NAND gate 161. The logic zero is supplied to the clear inputs of Flip-Flops 241 and 243 resetting these Flip-Flops such that their Q outputs are at the logic zero state. Since the D3 input of down counter 113 is at the logic zero state a logic one is provided at the output of inverter 149 which is supplied to the second input of NAND 151 resulting in a logic zero at the output of NAND gate 151. The logic zero is then supplied to the clear inputs of Flip-Flops 237 and 239 resetting these Flip-Flops such that their Q outputs are at the logic zero state.

Since the D2 input of down counter 113 is at the logic zero state a logic one is provided at the output of inverter 143 which is supplied to the second input of NAND 145 resulting in a logic zero at the output of NAND gate 145. The logic zero is then supplied to the clear inputs of Flip-Flops 233 and 235 resetting these Flip-Flops such that their Q outputs are at the logic zero state.

The logic one occurring at the D1 input of down counter 113 is inverted through NAND gate 135 to a logic zero and supplied to the preset inputs of Flip-Flops 229 and 231 resulting in the Q outputs of these Flip-Flops being set to the logic one state. The Q outputs of Flip-Flops 221, 223, 225 and 227 are similarly set to the logic zero state by the logic zero portion of the CLR signal of FIG. 3.

After the CLR signal transitions to the logic one state, down counter 113 will become operational with the Q outputs of Flip-Flops 243, 239, 235, 231, 227 and 223 being respectively 0,0,0,1,0,0. The INV_CLK signal (inverted clock) of FIG. 3 will then cause down counter 133 to begin its down count. Down counter 113 will continue its down count until the Q outputs of Flip-Flops 243, 239, 235, 231, 227 and 223 are respectively 0,0,0,0,0,1. The logic one at the Q output of Flip-Flop 223 is then supplied to inverter 171 which inverts the logic one to a logic zero. Since the Q outputs of Flip-Flops 243, 239, 235, 231 and 227 are now at the logic zero state and the output of inverter 171 has transitioned to the logic zero state the output of NOR gate 247 will transition from the logic zero state to the logic one state (identified as the 39.CLK signal of FIG. 3). The logic one from NOR gate 247 is supplied through the LOAD input of down counter 113 to AND gate 157 enabling AND gate 157 allowing a portion of the logic one state of the INV_CLK signal of FIG. 3 to pass through AND gate 157 and OR gate 159 to the first inputs of NAND gates 161, 153, 151, 147, 145, 139, 135, 133, 129, 127 and 125 again enabling NAND gates 161, 153, 151, 147, 145, 141, 139, 135, 133, 129, 127 and 125. NAND gates 161, 153, 151, 147, 145, 141, 139, 135, 133, 129, 127 and 125 are enabled for a period of time which is sufficient to allow another five bit word from three bit to eight bit decoder 53 to be loaded into the Flip-Flops of down counter 113. For the timing diagram of FIG. 3, bits D4, D3, D2, D1 and D0 will again be respectively 0,0,0,1,0 since the logic bits supplied to the F(2..0) inputs of circuit 29 does not change.

When the output of NOR gate 247 transitions from the logic zero state to the logic one state, this logic zero to one transition is supplied to the clock input of Flip-Flop 255. The logic one at the D input of Flip-Flop 255 is clocked to its Q output and then supplied to the first input of an AND gate 257 enabling AND gate 257. This allows the SI signal of FIG. 3 to pass through AND gate 257 to the SO output of circuit 29 which results in the SO signal of FIG. 3 being provided at the SO output of circuit 29.

As is best illustrated by the timing waveforms of FIG. 3, there is a delay of four pulses of the INV_CLK signal of FIG. 3 between the generation of the first SI pulse and the generation of the first SO pulse. This is the result of the three to eight decoder 53 providing a count of four to down counter 113.

Referring to FIGS. 1, 2, 3 and 8 the logic zero portion of the CLR signal of FIG. 3 is provided through the clear input of a gain circuit 71 to an AND gate 260 to the clear inputs of a peak detector circuit 263 and an averaging circuit 265. The logic zero of the CLR signal of FIG. 3 is also provided through the clear input of a gain circuit 71 to the set inputs of four bit latches 267 and 268. This logic zero clears peak detecting circuit 263 and averaging circuit 265. This logic zero signal also presets the Q0–Q3 outputs of circuits 267 and 268 to the logic one state. This, in turn, results in maximum gain being provided by gain circuit, that is gain bits Q6, Q5, Q4, Q3, Q2, Q1 and Q0 are each at the logic one state.

The eight most significant bits of each digital sample of the incoming analog signal are provided to gain circuit 71 after each digital sample is converted to a parallel format by serial to parallel converter 41 and then passed through tristate buffer 40. These eight bits FI13 through FI6 include a sign bit FI13 and seven data bits FI12, FI11, FI10, FI9, FI8, FI7 and FI6. When the sign bit is at the logic one state the digital equivalent signal is negative and in twos complement form and when the sign bit is at the logic zero state the digital equivalent signal is positive.

The sign bit FI13 is first provided to the D3 input of a four bit latch 262, while the three data bits FI12, FI11, and FI10 are supplied respectively to the D2, D1 and D0 inputs of four bit latch 262. Similarly, the four data bits FI9, FI8, FI7 and FI6 are supplied respectively to the D3, D2, D1 and D0 inputs of a four bit latch 261.

The logic zero to one transitions of the INV_CLK (inverted clock) signal of FIG. 3 latches the seven data bits FI12, FI11, FI10 and FI9, FI8, FI7 and FI6 and the sign bit FI13 of each digital sample into latches 261 and 262. The sign bit FI13 is supplied to the first inputs of EXCLUSIVE-OR gates 269, 270, 271, 272, 273, 274 and 275, while the data bits FI6, FI7, FI8, FI9, FI10, FI11 and FI12 are provided respectively to the second inputs of EXCLUSIVE-OR gates 269, 271, 273, 275, 272, 274 and 276. When the sign bit FI13 is one indicating a negative number each data bit FI6, FI7, FI8, FI9, FI10, FI11 and FI12 is inverted by EXCLUSIVE-OR gates 269, 271, 273, 275, 272, 274 and 276. When the sign bit FI13 is zero indicating a positive number each data bit FI6, FI7, FI8, FI9, FI10, FI11 and FI12 remains at the same logic state when passing through EXCLUSIVE-OR gates 269, 271, 273, 275, 272, 274 and 276.

Referring to FIGS. 1, 2, 3, 8 and 9, there is shown the peak detector circuit 263 which includes latch 280, latch 281, latch 297 and latch 298 as well as a comparison circuit 299 having six inverters 282, 283, 284, 285, 286 and 287; six AND gates 288, 289, 290, 291, 292 and 293 and an OR gate 295. When the first digital sample of four digital samples is supplied to circuit 263, comparison circuit 299 will provide a logic one at the output of OR gate 295.

At this time it should be noted that the sign bit is not supplied to peak detector circuit 263, that is the A7 line is not connected to peak detector circuit 263.

For example, when the sign bit is a logic zero indicating a positive number and the data bits FI6, FI7, FI8, FI9, FI10, FI11 and FI12 are respectively 0,0,0,0,1,0,0 a logic one is provided to the first input of AND gate 289. Since the Q2 and Q3 outputs of latch are at the logic zero state, the outputs of inverters 282 and 283 will be at the logic one state resulting in logic ones at the second and third inputs of AND gate 289 which then supplies a logic one to OR gate 295. The logic one occurring at the output of OR gate 295 is supplied to the first input of AND gate 296 enabling AND gate 296. Since inverter 294 inverts the INV_CLK signal, the signal provided through AND gate 296 to the clock input of latch 281 is identical to the CLK waveform illustrated in FIG. 3. The leading edge of this signal will latch bits FI6, FI7, FI8, FI9, FI10, FI11 and FI12 into latches 281 and 297.

The leading edge of the INV_CLK signal of FIG. 3 will next latch the six most significant bits FI7, FI8, FI9, FI10, FI11 and FI12 into latches 297 and 298 so that the Q2 and Q3 outputs of latch 297 are respectively 0,0 and the Q0, Q1, Q2 and Q3 outputs of latch 298 are respectively 0, 1, 0, 0.

If the second digital sample provided to circuit 263 has bits 0,0,0,0,0,1,0 (from least significant bit to most significant bit) then a logic one is provided to the first input of AND gate 288. Since the Q3 output of latch 298 is now at the logic zero state, inverter 282 will invert this logic zero to a logic one resulting in a logic one at the second input of AND gate 288. Logic ones are now being supplied to each of the inputs of AND gate 288 resulting in a logic one at its output which is then supplied through OR gate 295 to the first input of AND gate 296 again enabling AND gate 296.

Bits 0,0,0,0,0,1,0 are first latched into latches 281 and 280 by the CLK signal of FIG. 3 and then bits 0,0,0,0,1,0 are latched into latches 297 and 298 by the INV_CLK signal of FIG. 3.

If the third and fourth digital samples are 0,0,0,0,1,0,0 (from least significant bit to most significant bit) then a logic one is supplied to the first input of AND gate 289. However, since the Q2 output of latch 289 is now at the logic one state, inverter 283 will invert this logic one to a logic zero resulting in a logic zero being supplied to the second input of AND gate 289. This results in a logic zero at the output of AND gate 289 which is supplied to the third input of OR gate 295. Line D6, which is connected to the first input of OR gate 295, supplies a logic zero to the first input of OR gate 295. Since lines D5, D3, D2, D1 and D0 are at the logic zero state the outputs of AND gates 288, 290, 291, 292 and 293 will be at the logic zero state resulting in logic zeros at each input of OR gate 295. This logic zero is next supplied to the first input of AND gate 296 inhibiting AND gate 296 which prevents the CLK signal from passing through AND gate 296 to the CLK input of latch 281.

Since the P/A input to gain circuit 71 is at the logic one state AND gates 318, 316, 314, 307, 309, 311 and 313 are enabled allowing data bits FI6, FI7, FI8, FI9, FI10, FI11 and FI12 which are respectively 0,0,0,0,0,1,0 to pass through these gates. Data bits FI6, FI7, FI8, FI9, FI10, FI11 and FI12 then respectively pass through OR gates 324, 322, 320, 323, 325, 327 and 329 to the D1, D2, D3 inputs of latch 268 and the D0, D1, D2 and D3 inputs of latch 267. While the 39.CLK signal of FIG. 3 is at the logic one state, the logic zero to one transition of INV_CLK signal will latch the bits 0,0,0 respectively to the Q1, Q2 and Q3 outputs of latch 268 and the bits 0,0,1,0 respectively to the Q0, Q1, Q2 and Q1 outputs of latch 267 and then to an encoder circuit 110 and a data selector circuit 112.

Referring to FIGS. 1, 2, 3, 8, 10 and 11, the four digital samples are averaged by circuit 265 for the waveforms of FIG. 3. The logic zero portion of the clear signal of FIG. 3 first clears four bit latches 337, 338 and 339.

When the first sample of the seven data bits FI6, FI7, FI8, FI9, FI10, FI11 and FI12 are respectively 0,0,0,0,1,0,0 and bit FI13 is a logic zero indicating that the sample is positive, the sample will pass directly through four bit adders 331 to the D0–D3 inputs of latch 341 and pass directly through four bit adder 332 to the D0–D2 inputs of latch 343.

At this time it should be noted that the sign bit FI13 is supplied to the CO (carry out) input of adder 331; data bits FI6, FI7, FI8 and FI9 are respectively supplied to the A1, A2, A3 and A4 inputs of adder 331 and data bits FI10, FI11 and FI12 are respectively supplied to the A1, A2 and A3 inputs of adder 332. It should also be noted that the A4 input of adder 332 is connected to ground which provides a logic zero to this input.

Since inverter 335 inverts the INV_CLK signal of FIG. 3 the signal provided to the clock input of latches 341, 343 and 345 is identical to the CLK waveform illustrated in FIG. 3. This CLK signal will first clock the bits 0,0,0,0,1,0,0,0 into latches 341 and 343. Bits 0,0,0,0 are next provided to the D0–D3 inputs of latch 337, bits 1,0,0,0 are provided to the D0–D3 inputs of latch 338 and clocked in these latches 337 and 338 by the rising edge of the INV_CLK signal of FIG. 3.

If the second digital sample provided to circuit 265 has data bits 0,0,0,0,0,1,0 and the sign bit is 0 the resultant 8 bit signal provided at the S1, S2, S3 and S4 outputs of adder 331 and the S1, S2, S3 and S4 outputs of adder 332 is respectively 0,0,0,0,1,1,0,0 with this resultant eight bit signal being clocked into latches 341 and 343 by the CLK signal of FIG. 3. The INV_CLK signal of FIG. 3 will then latch bits 0,0,0,0 into latch 337 and the bits 1,1,0,0 into latch 338.

In a like manner when the third digital sample has data bits 0,0,0,0,0,0,1 and the sign bit is 0 the resultant 8 bit signal provided at the S1, S2, S3 and S4 outputs of adder 331 and the S1, S2, S3 and S4 outputs of adder 332 is respectively 0,0,0,0,1,1,1,0 with this signal being clocked into latches 341 and 343 by the CLK signal of FIG. 3. The INV_CLK signal of FIG. 3 will then latch the bits 0,0,0,0 into latch 337 and the bits 1,1,1,0 into latch 338.

When the fourth digital data sample is 0,0,0,1,0,0,1 and the sign bit is 0 the resultant 8 bit signal provided at the S1, S2, S3 and S4 outputs of adder 331 and the S1, S2, S3 and S4 outputs of adder 332 is respectively 0,0,0,1,1,1,0,1 (from least significant bit to most significant bit) with this signal being clocked into latches 341 and 342 by the CLK signal of FIG. 3.

It should be noted that whenever there is provided at the C4 output of adders 331, 332 or 333 a logic one carry bit this logic one is supplied to the CO input of the next successive adder. For example a logic one at the C4 output of adder 331 would result in a logic one being supplied to the CO input of adder 332. If the A1 and B1 inputs to adder 332 are at the logic zero state then the S1 output will be at the logic one state.

The INV_CLK signal will next latch the 0,0,0,1 from latch 341 and the 1,1,0,1 from latch 343 respectively into latches 337 and 338.

After the sum of the four digital samples is latched into latches 341 and 343 the bits occurring on data lines B0, B1, B2, B3, B4, B5, B6, B7, B8, B9, B10 and B11 are respectively 0,0,0,1,1,1,0,1,0,0,0,0. These bits are provided to a filter select system consisting of seven identical filter select circuits 347, 348, 349, 350, 351, 352 and 353 which are illustrated by the circuit diagram of FIG. 11.

Since the filter select circuits are identical in operation only the operation of filter select circuit 347 will be discussed at this time. Logic zeros are provided by latches 341 and 343 to the D5 and D3 inputs of filter select circuit 347 while logic ones are provided by latches 341 and 343 to the D4, D2, D1 and D0 inputs of filter select circuit 347.

Since three to eight decoder 53 provided a logic one to the F1 input of gain circuit 71 a logic one is provided to the first input of AND gate 369 enabling AND gate 369 of filter select circuits 347. This allows the logic one provided to the D2 inputs of filter select circuit 347 to pass through AND gate 369 and OR gate 377 of filter select circuit 347 to the Q3 line of gain circuit 71.

In a like manner whenever a logic one is supplied to the F1 input of gain circuit 71 a logic one is provided to the first input of AND gate 369 of each filter select circuit 347–353 enabling AND gate 369 of each filter select circuit 347–353. This allows the data bit occurring at the D2 input of each filter select circuit 347–353 to pass through the filter select circuit.

This resultant seven bit signal from filter select circuits 347–353 is then provided to AND gates 312, 310, 308, 315, 317, 319 and 321 and will pass through these gates and then through OR gates 324, 322, 320, 323, 325, 327 and 329 to the D1, D2, D3 inputs of latch 268 and the D0, D1, D2 and D3 inputs of latch 267 when the P/A input to gain circuit 71 is at the logic zero state. While the 39.CLK signal of FIG. 3 is at the logic one state, the logic zero to one transition of INV_CLK signal will latch the bits to the Q1, Q2 and Q3 outputs of latch 268 and the Q0, Q1, Q2 and Q3 outputs of latch 267 and then to a gain encoder circuit 110 and a data selector circuit 112.

It should be noted that when the 39.CLK signal of FIG. 3 is at the logic one state, the logic zero to one transition of INV_CLK signal of FIG. 3 will result in a logic zero at the output of inverter 303 which is then supplied through AND gate 260 to the CLR inputs of peak detector circuit 263 and averaging circuit 265. This logic zero clears latches 297 and 298 of peak detector circuit 263 and latches 337, 338 and 339 of averaging circuit 265 allowing either peak detector circuit 263 or averaging circuit 265 to process another four digital samples provided to gain circuit 71.

It should also be noted that a logic one at the output of AND gate 69 of decoder circuit 53, FIG. 5, results in two digital samples being be processed by gain control circuit 71; a logic one at the output of AND gate 67 results in four digital samples being processed by gain control circuit 71; a logic one at the output of AND gate 65 results in eight digital samples being processed by gain control circuit 71; a logic one at the output of AND gate 61 results in eight digital samples being processed by gain control circuit 71 and a logic one at the output of AND gate 63 results in thirty two digital samples being processed by gain control circuit 71.

Referring to FIGS. 1, 2, 3, 8 and 12, there is shown gain encoder circuit 110 which encodes the seven bits D6–D0 from latches 266 and 267 of gain circuit 71. At this time it should be noted that the waveforms of FIG. 3 illustrate the processing of an equivalent fourteen bit digital signal when the P/A signal is at the logic zero state.

The following table illustrates the Q0, Q1 and Q2 outputs provided by encoder circuit 110 for each 7 Bit signal provided to encoder circuit 110.

TABLE I

| INPUTS | | | | | | | OUTPUTS | | | X = DON'T |
|---|---|---|---|---|---|---|---|---|---|---|
| D6 | D5 | D4 | D3 | D2 | D1 | D0 | Q2 | Q1 | Q0 | CARE |
| 1 | X | X | X | X | X | X | 1 | 1 | 1 | |
| 0 | 1 | X | X | X | X | X | 1 | 1 | 0 | |
| 0 | 0 | 1 | X | X | X | X | 1 | 0 | 1 | |
| 0 | 0 | 0 | 1 | X | X | X | 1 | 0 | 0 | |
| 0 | 0 | 0 | 0 | 1 | X | X | 0 | 1 | 1 | |
| 0 | 0 | 0 | 0 | 0 | 1 | X | 0 | 1 | 0 | |
| 0 | 0 | 0 | 0 | 0 | 0 | 1 | 0 | 0 | 1 | |
| 0 | 0 | 0 | 0 | 0 | 0 | 0 | 0 | 0 | 0 | |

When, for example, D6, D5, D4, D3, D2, D1 and D0 inputs to circuits 110 are respectively 0,0,0,0,0,1,0, the output of NOR gate 381 will be at the logic one state resulting in a logic one at both inputs of AND gate 386 which then provides at its output a logic one. This logic one is supplied through OR gate 392 to the D1 input of latch 395. The INV_CLK signal of FIG. 3 then clocks the logic one at the D1 of latch 395 to the Q1 output of latch 395. This, in turn, results in the Q2, Q1 and Q0 outputs of encoder circuit 110 being 0,1,0. This, in turn, indicates a gain of two for doppler video processing circuit 29. When, for example, the Q2, Q1 and Q0 outputs of encoder circuit 110 are respectively 1,0,0 then the gain is four. Similarly, when the Q2, Q1 and Q0 outputs of encoder circuit 110 are respectively 0,1,1 then the gain is three.

Figure 13:
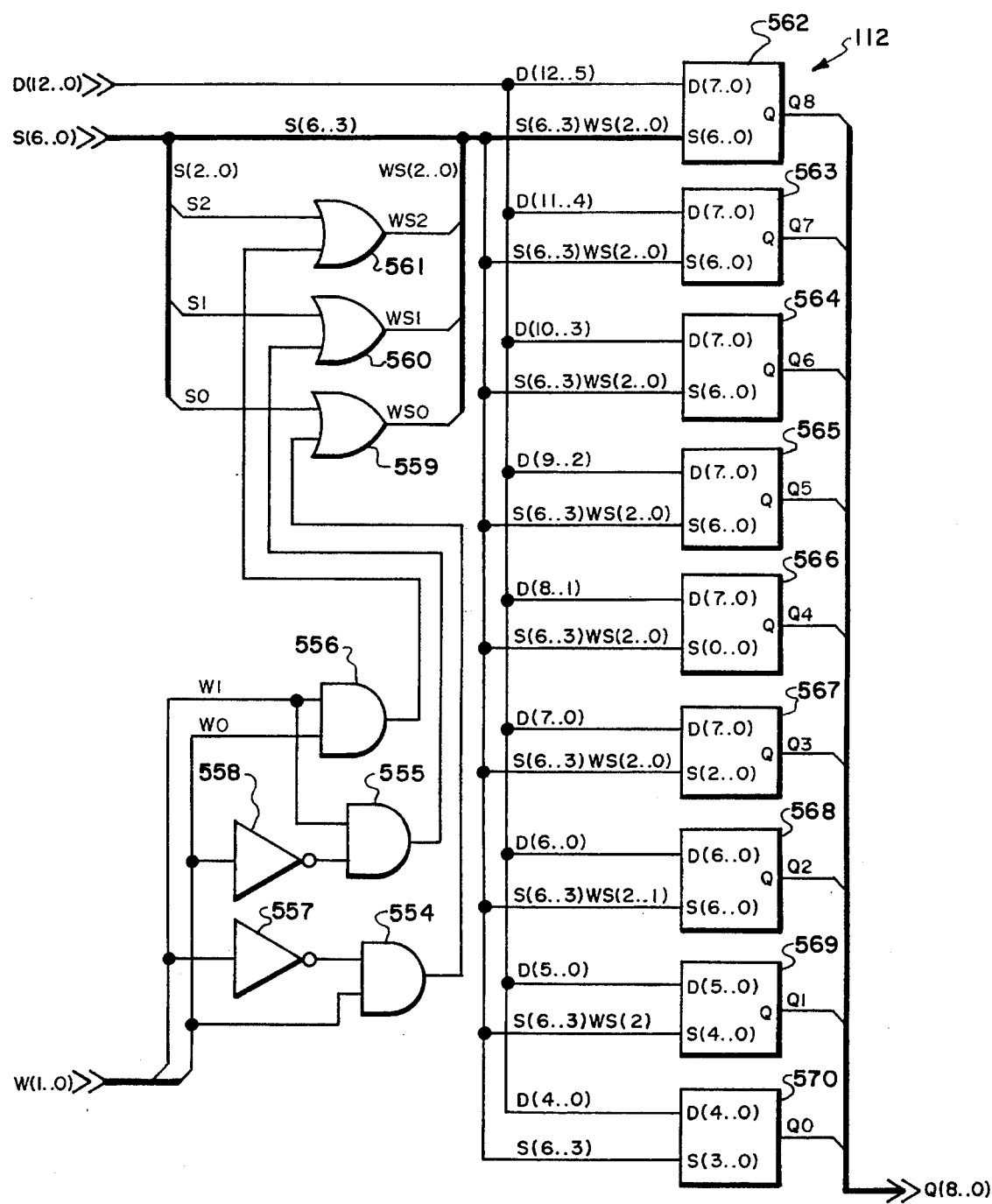
FIG. 13 is a detailed logic diagrams of the data selector circuit of the circuit of FIG. 2.
Figure 14:
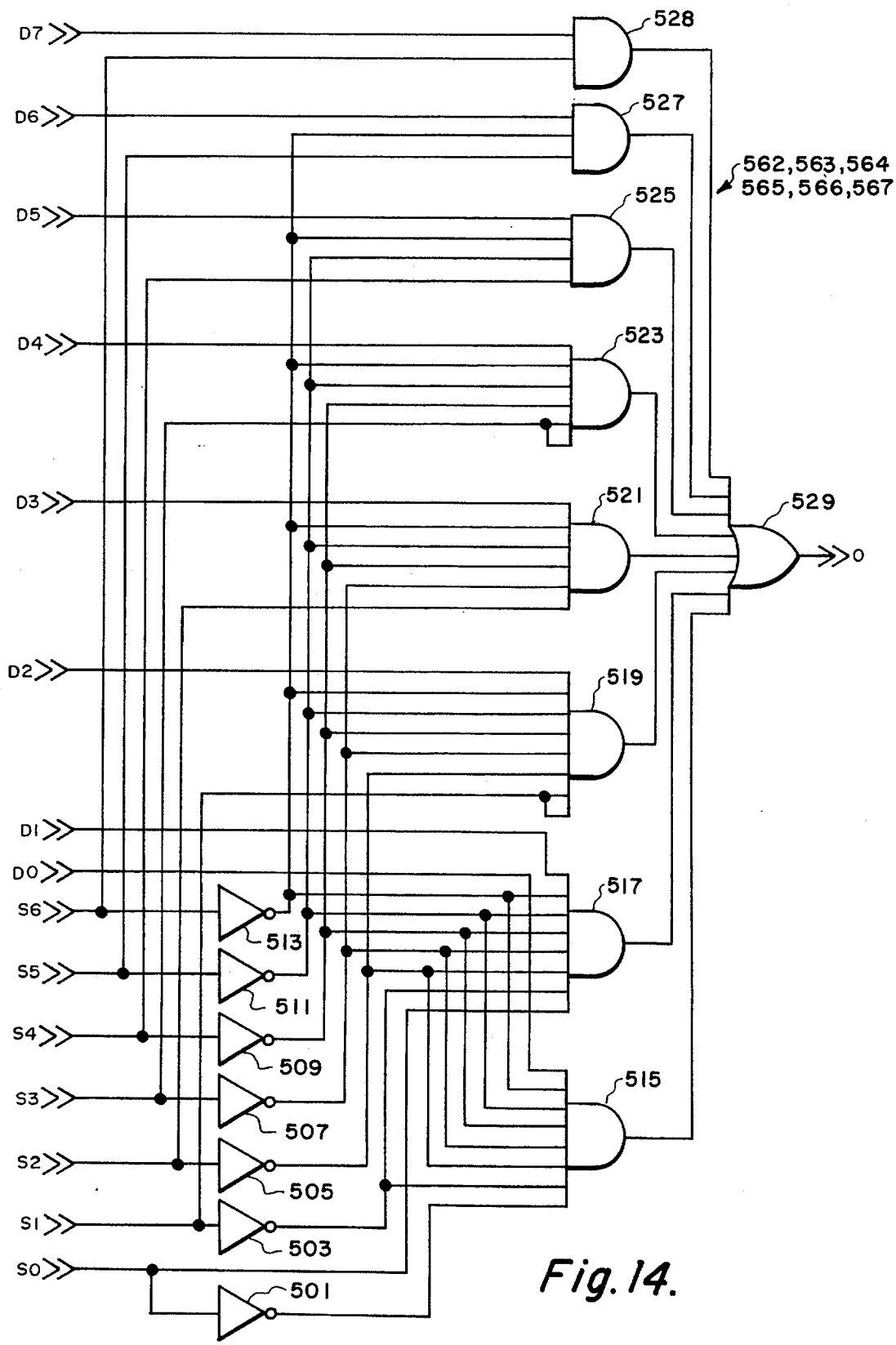
FIG. 14 is a detailed logic diagram of some of the bit selector circuits of the data selector circuit of FIG. 13.

Referring to FIGS. 13 and 14 the following table illustrates the length of the word utilized by the missile's telemetry system to transmit data to a ground station or the like.

TABLE II

| INPUTS | | |
|---|---|---|
| W1 | W0 | WORD LENGTH |
| 0 | 0 | Five Bits |
| 0 | 1 | Six Bits |
| 1 | 0 | Seven Bits |
| 1 | 1 | Eight Bits |

The word length also effects the operation of the data selector circuit 112. Data selector circuit 112 includes a decoder circuit consisting of a pair of inverters 557 and 558, three AND gates 554, 555 and 556 and three OR gates 559, 560 and 561. When, for example, the W1 and W0 inputs to data selector circuit 112 are at the logic zero state, the outputs of each AND gate 554, 555 and 556 will be at the logic zero state resulting in logic zeros at the first inputs of OR gates 559, 560 and 561. This allows bits S2, S1 and S0 from gain circuit 71 to respectively pass through OR gates 561, 560 and 559 without changing the logic state of these bits. When, for example, W1 is a logic one and W0 is a logic zero, the output of AND gates 556 and 554 will be at the logic zero state, while the output of AND gate 555 will be at the logic one state. The logic one from AND gate will result in a logic one at OR gate 560 resulting in a logic one on the WS1 input lines to bit selector circuits 562, 563, 564, 565, 566, 567 and 568.

For an eight bit word, that is logic ones are supplied to the W1 and W0 inputs of data selector circuit 112, the following table illustrates the operation of circuit 112.

TABLE III

| INPUTS | | | | | | | OUTPUTS | X = DON'T |
|---|---|---|---|---|---|---|---|---|
| S6 | S5 | S4 | S3 | WS2 | WS1 | WS0 | Q8–Q0 | CARE |
| 1 | X | X | X | 1 | X | X | D12–D4 | |
| 0 | 1 | X | X | 1 | X | X | D11–D3 | |
| 0 | 0 | 1 | X | 1 | X | X | D10–D2 | |
| 0 | 0 | 0 | 1 | 1 | X | X | D9–D1 | |
| 0 | 0 | 0 | 0 | 1 | X | X | D8–D0 | |
| 0 | 0 | 0 | 0 | 1 | 1 | X | D8–D0 | |
| 0 | 0 | 0 | 0 | 1 | 0 | 1 | D8–D0 | |
| 0 | 0 | 0 | 0 | 1 | 0 | 0 | D8–D0 | |

When the W1 and W0 inputs to circuit 112 are at the logic one state a logic one is supplied to the first and second inputs of AND gate 556 resulting in a logic one at the output of OR gate 561. As illustrated in Table III the WS2 bit which is the output of OR gate 561 will always be at the logic one state regardless of the logic state of bits S6–S0 which are provided by gain circuit 71 to data selector circuit 112. This, in turn, insures each bit selector circuit 562, 563, 564, 565, 566, 567, 568, 569 and 570 will pass a data bit.

At this time it should be noted that the circuit illustrated in FIG. 14 is the circuit for bit selectors 562, 563, 564, 565, 566 and 567. Bit selector 568 is identical to the bit selector of FIG. 14 except it does not have one eight input AND gate 515 which is included in the circuit of FIG. 14. Similarly, bit selector 569 is identical to the bit selector of FIG. 14 except it does not have two eight input AND gates 515 and 517 which are included in the circuit of FIG. 14. In a like manner, bit selector 570 is identical to the bit selector of FIG. 14 except it does not have the three eight input AND gates 515, 517 and 519 of the circuit of FIG. 14.

Bit selector circuit 570 consist of five AND gates 528, 527, 525, 523 and 521 and four inverters 513, 511, 509 and 507. Bit selector circuit 569 consist of six AND gates 528, 527, 525, 523, 521 and 519 and five inverters 513, 511, 509, 507 and 505. Bit selector circuit 568 consist of seven AND gates 528, 527, 525, 523, 521, 519 and 517 and six inverters 513, 511, 509, 507, 505 and 503.

For bit selector circuit 570, for example, data bit D4 is supplied to the first input of AND gate 528 and selector bit S6 is supplied to the second input of AND gate 528.

To illustrate the operation of the bit selector 562 when W1 and W0 are logic ones assume that bit S6 is at the logic one state, that bits D12, D11, D10, D9, D8, D7, D6, D5, D4, D3, D2, D1 and D0 are respectively 1,1,1,0,0,0,1,0,0. Bit D12 which is a logic one is supplied to the D7 input of bit selector circuit 562 while bit S6 and WS2 are supplied respectively to the S6 and S2 inputs of bit selector circuit 562. The logic one occurring at the S6 input of bit selector circuit 562 is supplied to the first input of AND gate 528 enabling AND gate 528 allowing the logic one at the D7 input of bit selector circuit 562 to pass through AND gate 528 to the output of circuit 562 resulting in a logic one on the Q8 line. In a like manner bits D11, D10, D9, D8, D7, D6, D5 and D4 will respectively pass through bits selector circuits 563, 564, 565, 566, 567, 568, 569 and 570 since AND gate 528 is enabled in each of these bit selector circuits. The nine bits occurring on the Q8, Q7, Q6, Q5, Q4, Q3, Q2, Q1 and Q0 lines of circuit 112 are identical to the nine bits input to circuit 112, that is bits D12 through D4 pass through bit selector circuits 562, 563, 564, 565, 566, 567, 568, 569 and 570 as shown in Table III.

Referring now to FIGS. 1, 2, 13 and 14 the following example illustrates the operation of data selector circuit 112 when the gain is four, W0 and W1 are logic ones and the first digital equivalent signal provided to the FO(13....0) inputs of circuit 29 has a hexadecimal value 0A2A which, in turn, is binary 0,0,1,0,1,0,0,0,1,0,1,0,1,0 (sign bit D13 and data bits D12–D0). The gain from encoder circuit 110 is four which in accordance with TABLE I requires that only the S3 input line to bit selector circuits 562–570 and the WS2 input line to bit selector circuits 562–569 be set at the logic one state. For the purpose of illustration bits S1 and S0 may be respectively 0,0.

Referring to FIGS. 13 and 14 the logic one occurring at the S3 input line of bit selector circuit 562 is supplied to the first and second inputs of AND gate 523. The outputs of inverters 509, 511 and 513 are respectively supplied to the third, fourth and fifth inputs of AND gates 523. Since these outputs are logic ones AND gate 523 is enabled allowing data bit D9, which is a logic one, to pass through AND gate 523 to the output of bit selector circuit 562.

In a like manner data bit D8, which is a logic one, passes through bit selector circuit 563. AND gate 523 of bit selector circuit 563 is enabled allowing data D8, which is a logic zero to pass through AND gate 563 to the output of bit selector circuit 562. The binary bits 1,0,0,0,1,0,1,0,1 (data bits D9–D1) will pass through bit selector circuits 462–470 respectively to the Q8, Q7, Q6, Q5, Q4, Q3, Q2, Q1 and Q0 outputs of circuit 112.

At this time it should be noted that the hexadecimal equivalent of each set of data bits or words output by data selector circuit 112 is identified as the ATA_SEL_OUT signal of FIG. 3.

Figure 15:
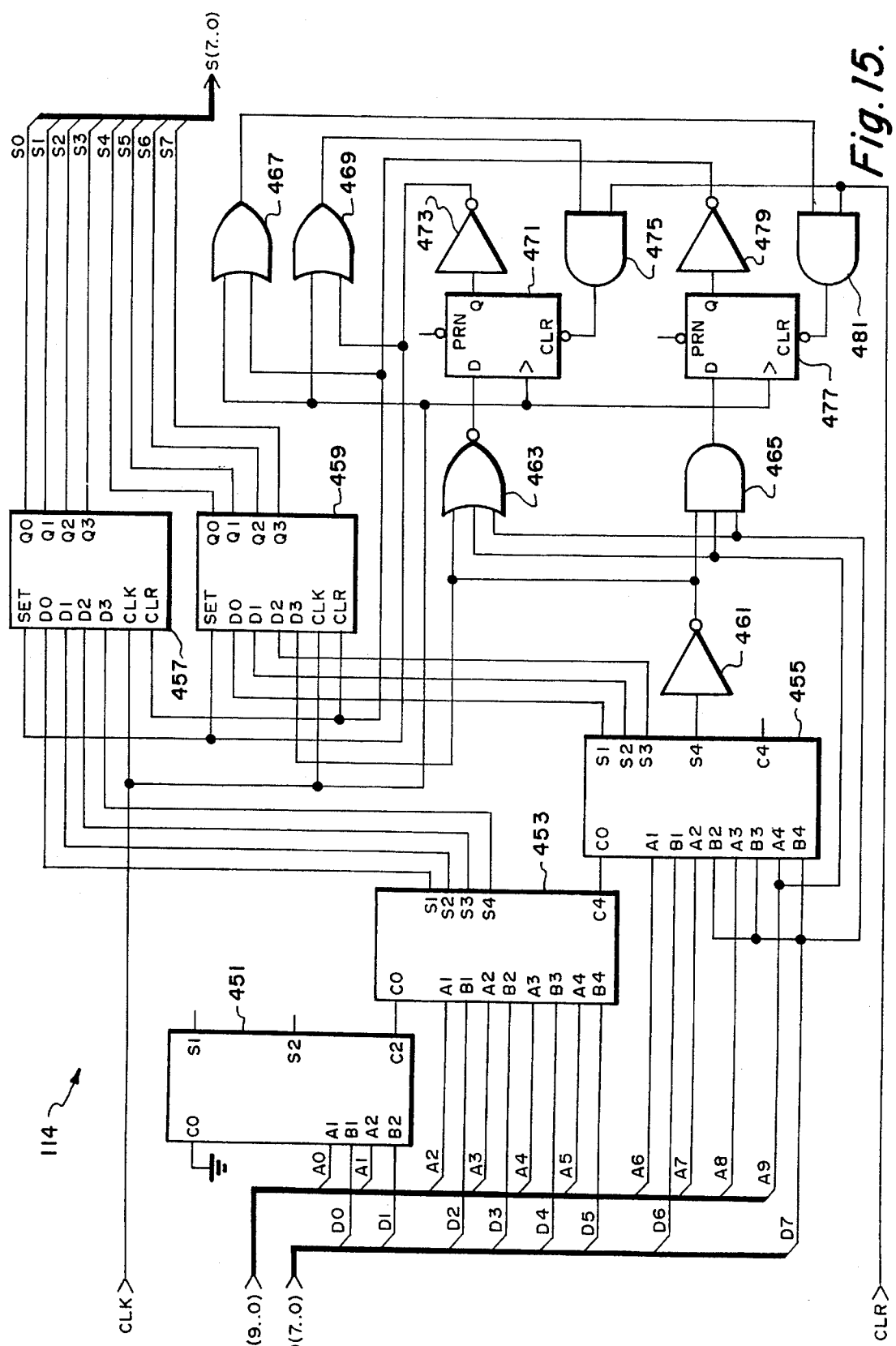
FIG. 15 is a detailed logic diagram of the dither adder circuit of the circuit of FIG. 2.

Referring to FIGS. 1, 2, and 15, the following example is provided for the purpose of illustrating the operation of dither adder circuit 114. Assume the first eight bit digital equivalent signal provided to A(9...0) inputs of dither adder circuit 114 includes an 0A2 signal from data selector circuit 112 and a logic zero sign bit. The digital equivalent of the 0A2 hexadecimal signal is 0,1,0,1,0,0,0,1,0. Further, assume that the dither component provided by EEPROM 27 is hexadecimal one (01) having a binary equivalent of 0,0,0,0,0,0,0,0,1.

The logic zero sign bit is supplied to the A9 input of dither adder circuit 114 and the nine data bits 0,1,0,1,0,0,0,1,0 are supplied respectively to the A8, A7, A6, A5, A4, A3, A2, A1 and A0 inputs of circuit 114. The dither component added to this signal is 0,0,0,0,0,0,0,1 meaning that only the D0 input to dither adder circuit 114 is at the logic one state. It should be noted that the dither component is identified as D(7...0) in FIG. 3.

Adders 451, 453 and 455 next add the dither component to the ten bit digital equivalent signal. This results in the S1 and S2 outputs of adder 451 being logic ones, the S1, S2, S3 and S4 outputs of adder 453 being respectively 0,0,0,1 and the S1, S2, S3 and S4 outputs of adder 455 being respectively 0,1,0,0. The 0,0,0,1 from adder 453 is supplied respectively to the D0, D1, D2 and D3 inputs of latch 457 while the 0,1,0 from adder 455 is supplied respectively to the D0, D1 and D2 inputs of latch 459. The logic zero from the S4 output of adder 445 is supplied to inverter 461 which inverts the logic zero to a logic one which is then supplied to the D3 input of latch 459. The INV_CLK signal of FIG. 3 will then clock the bits 0,0,0,1 through latch 457 and the bits 0,1,0,1 through latch 459 resulting in an eight bit hexadecimal A8 equivalent signal at the S(7...0) output of circuit 114. This, in turn, is the DD(7...0) signal of FIG. 3.

Dither adder circuit 114 also provides for an overflow condition wherein each bit occurring at the Q0–Q3 outputs of latches 457 and 459 is a logic one and an underflow condition wherein each bit occurring at the Q0–Q3 outputs of latches 457 and 459 is a logic zero.

An overflow condition occurs whenever the sign bits A9 and D7 are both logic zeros indicating that the dither component and the digital signal from data selector circuit 112 are positive and the S4 output of adder 455 is at the logic one state. The logic one is next provided to inverter 461 which inverts the logic one to a logic zero resulting in logic zeros at each input of NOR gate 463. NOR gate 463 then provides a logic one to the D input of Flip-Flop 471 which is clocked through Flip-Flop 471 to the input of inverter 473 by the INV_CLK signal of FIG. 3. This logic one is next inverted to a logic zero by inverter 473 resulting in a logic zero being provided to the SET inputs of latches 457 and 459 which presets each output Q0–Q3 of latches 457 and 459 to the logic one state.

An underflow condition occurs whenever each input of AND gate 465 is at the logic one state. The sign bits A9 and D7 are both logic ones indicating that the dither component and the digital signal from data selector circuit 112 are negative and the S4 output of adder 455 is at the logic zero state. The logic zero from the S4 output of data selector circuit 112 is next provided to inverter 461 which inverts the logic zero to a logic one resulting in logic ones at each input of AND gate 465. AND gate 465 then provides a logic one to the D input of Flip-Flop 477 which is clocked through Flip-Flop 477 to the input of inverter 479 by the INV_CLK signal of FIG. 3. This logic one is next inverted to a logic zero by inverter 479 resulting in a logic zero being provided to the clear inputs of latches 457 and 459 which resets each output Q0–Q3 of latches 457 and 459 to the logic zero state.

While the present invention has been illustrated with the preferred embodiment, it is recognized that variations and changes may be made therein without departing from the invention as set forth in the claims.

What is claimed is:

1. A dithered analog-to-digital conversion circuit with gain control, comprising:

an analog to digital converter having an input for receiving an analog video signal, said analog to digital converter converting said analog video signal to an equivalent digital signal having a plurality of digital data samples, each of said digital data samples having thirteen data bits and a sign bit;

said analog to digital converter generating a frame start signal;

serial to parallel conversion means for receiving said digital equivalent signal and converting said digital equivalent signal from a serial form to a parallel form;

first programmed memory means for digitally generating a sequence of dither components;

second programmed memory means for digitally generating a first logic signal and a word length control signal;

decoder means for receiving said first logic signal and decoding said first logic signal to provide a second logic signal;

clock signal generating means for receiving a system clock signal and said frame start signal, said clock signal generating means, responsive to said system clock signal and said frame start signal, generating a strobe data in signal and an internal clock signal;

a down counter coupled to said decoder means and said clock signal generating means for receiving said internal clock signal and said second logic signal, said down counter, responsive to said internal clock signal, counting down from a first binary number set within said down counter when said down counter receives and decodes said second logic signal;

said down counter providing a latch pulse when said binary counter counts down from said first binary number to a second binary number preset within said down counter;

latching means having a data input for receiving a logic one signal, a clock input connected to said down counter for receiving said logic pulse and an output, said latching means, responsive to said latch pulse, latching to the output of said latching means said logic one signal;

gating means having a first input for receiving said logic one signal, a second input for receiving said data strobe in signal, and an output, said logic one signal enabling said gating means allowing said data strobe in signal to pass through said gating means to provide at the output of said gating means a data strobe out signal;

a first-in, first-out memory coupled to said serial to parallel conversion means, said clock signal generating means and the output of said gating means, said first-in, first-out memory, responsive to said data strobe in signal, temporarily storing the digital data samples of said digital equivalent signal;

said first-in, first-out memory receiving said data strobe out signal from said gating means, said data strobe out signal effecting a retrieval of the digital data samples of said digital equivalent signal stored in said first-in, first-out memory;

gain control circuit means for receiving first, second, third, fourth, fifth, sixth, and seventh most significant data bits of said digital data samples and said sign bit for each of said digital data samples;

said gain control circuit means calculating an average value of said first, second, third, fourth, fifth, sixth, and seventh most significant bits for a predetermined number of digital data samples, said gain control circuit means generating a word length control signal indicative of said average value, said gain control circuit means factoring in the sign bit of each digital data sample when calculating said average value for said predetermined number of digital data samples;

said gain control circuit means receiving said latch pulse and being reset by said latch pulse to allow for subsequent average value calculations of said predetermined number of digital data samples; and a data selector circuit coupled to an output of said first-in, first-out memory for receiving the thirteen data bits of said digital data samples from said first-in, first-out memory;

said data selector circuit coupled to an output of said gain control circuit means for receiving said word length control signal from said gain control circuit means, said data circuit means, responsive to said word length control signal selecting an optimum number of data bits of the thirteen data bits of each digital data sample to maximize digital video information being provided by said dithered analog-to-digital conversion circuit;

said data selector circuit providing said optimum number of data bits of each digital data sample selected by said data selector circuit to an output of said data selector circuit; and binary adder means coupled to the output of said data selector circuit for receiving the optimum number of data bits of each digital data sample;

said binary adder means being coupled to the output of said gating means for receiving said data strobe out signal, said data strobe out signal effecting an addition of the optimum number of data bits of each digital data sample to one of said sequence of dither components to provide a digital output signal.

2. The dithered analog-to-digital conversion circuit of claim 1 wherein said data selector circuit comprises:

a first inverter 557 having an input for receiving a first bit of said word length control signal and an output;

a second inverter 558 having an input for receiving a second bit of said word length control signal and an output;

a first AND gate 554 having a first input connected to the output of said first inverter 557, a second input for receiving the second bit of said word length control signal and an output;

a second AND gate 555 having a first input connected to the output of said second inverter 558, a second input for the first bit of said word length control signal and an output;

a third AND gate 556 having a first input for receiving the first bit of said word length control signal, a second input for receiving the second bit of said word length control signal and an output;

a first OR gate 559 having a first input for receiving a first bit of said gain control signal, a second input connected to the output of said first AND gate 554 and an output;

a second OR gate 560 having a first input for receiving a second bit of said gain control signal, a second input connected to the output of said second AND gate 555 and an output;

a third OR gate 561 having a first input for receiving a third bit of said gain control signal, a second input connected to the output of said third AND gate 556 and an output;

a first bit selector circuit 562 having eight data inputs for receiving a first selected group of eight data bits of each of said digital data samples, first, second, third and fourth select inputs for respectively receiving fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a second bit selector circuit 563 having eight data inputs for receiving a second selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a third bit selector circuit 564 having eight data inputs for receiving a third selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a fourth bit selector circuit 565 having eight data inputs for receiving a fourth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a fifth bit selector circuit 566 having eight data inputs for receiving a fifth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a sixth bit selector circuit 567 having eight data inputs for receiving a sixth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a seventh bit selector circuit 568 having seven data inputs for receiving a seventh selected group of seven data bits of each of said digital data samples, first, second, third and fourth select inputs for respectively receiving said fourth, fifth, sixth and seventh bits of said gain control signal, a fifth select input connected to the output of said second OR gate 560, a sixth select input connected to the output of said third OR gate 561, and an output connected to said binary adder means;

a eighth bit selector circuit 569 having six data inputs for receiving an eighth selected group of six data bits of each of said digital data samples, first, second, third and fourth select inputs for respectively receiving said fourth, fifth, sixth and seventh bits of said gain control signal, a fifth select input connected to the output of said third OR gate 561, and an output connected to said binary adder means; and a ninth bit selector circuit 570 having five data inputs for receiving a ninth selected group of five data bits of each of said digital data samples, first, second, third and fourth select inputs for respectively receiving said fourth, fifth, sixth and seventh bits of said gain control signal, and an output connected to said binary adder means.

3. The dithered analog-to-digital conversion circuit of claim 1 wherein said first and said second programmed memory means each comprise an Electrical Erasable Programmed Read Only Memory.

4. The dithered analog-to-digital conversion circuit of claim 1 wherein said latching means comprises a D Flip-Flop.

5. The dithered analog-to-digital conversion circuit of claim 1 wherein said gating means comprises a two input AND gate.

6. The dithered analog-to-digital conversion circuit of claim 1 further comprising a binary counter connected to said first programmed memory means and said second programmed memory means for providing addressing to said first programmed memory means and said second programmed memory means.

7. The dithered analog-to-digital conversion circuit of claim 1 wherein said serial to parallel conversion means comprises a fourteen bit serial to parallel converter.

8. The dithered analog-to-digital conversion circuit of claim 1 wherein said decoder means comprises:

a first inverter 55 having an input for receiving a first bit of said first logic signal and an output;

a second inverter 57 having an input for receiving a second bit of said first logic signal and an output;

a third inverter 59 having an input for receiving a third bit of said first logic signal and an output;

a first AND gate 61 having a first input for receiving said first bit of said first logic signal, a second input connected to the output of said second inverter 57, a third input for receiving said third bit of said first logic signal and an output connected to said down counter and said gain control circuit means;

a second AND gate 63 having a first input for receiving said first bit of said first logic signal, a second input connected to the output of said second inverter 57, a third input connected to the output of said third inverter 59 and an output connected to said down counter and said gain control circuit means;

a third AND gate 65 having a first input connected to the output of said first inverter 55, a second input for receiving the second bit of said first logic signal, a third input for receiving the third bit of said first logic signal and an output connected to said down counter and said gain control circuit means;

a fourth AND gate 65 having a first input connected to the output of said first inverter 55, a second input for receiving the second bit of said first logic signal, a third input connected to the output of said third inverter 59 and an output connected to said down counter and said gain control circuit means; and a fifth AND gate 65 having a first input connected to the output of said first inverter 55, a second input connected to the output of said second inverter 57, a third input for receiving the third bit of said first logic signal and an output connected to said down counter and said gain control circuit means.

9. The dithered analog-to-digital conversion circuit of claim 1 wherein said clock signal generating means comprises:

a first Flip-Flop 85 having a clock input for receiving said frame start signal, a data input for receiving said logic one signal, a clear input for receiving a clear signal and a Q output;

a second Flip-Flop 77 having a clock input for receiving said frame start signal, a data input connected to the Q output of said first Flip-Flop 85, a clear input and a Q output;

a first inverter 75 having an input for receiving said system clock signal and an output;

a third Flip-Flop 79 having a clock input connected to the output of said first inverter 75, a data input connected to the Q output of said second Flip-Flop 77, a clear input for receiving said clear signal and a Q output;

a first AND gate 73 having a first input for receiving said system clock signal, a second input connected to the Q output of said third Flip-Flop 79 and an output for providing said strobe data in signal;

a second inverter 81 having an input connected to the Q output of said third Flip-Flop 79 and an output;

a second AND gate 73 having a first input connected to the output of said second inverter 81, a second input for receiving said clear signal and an output connected to the clear input of said second Flip-Flop 77;

an OR gate 105 having a first input connected to the output of said second AND gate 73, a second input and an output for providing said internal clock signal;

a fourth Flip-Flop 109 having a clock input connected to the output of said OR gate 109, a data input for receiving said logic one signal, a clear input and a Q output connected to the second input of said OR gate 105;

a fifth Flip-Flop 89 having a clock input for receiving said system clock signal, a data input, a clear input connected to the Q output of said fourth Flip-Flop 109 and a Q output;

a third inverter 87 having an input connected to the Q output of said fifth Flip-Flop 89 and an output connected to the D input of said fifth Flip-Flop 89;

a sixth Flip-Flop 93 having a clock input connected to the output of said third inverter 87, a data input, a clear input connected to the Q output of said fourth Flip-Flop 109 and a Q output;

a fourth inverter 91 having an input connected to the Q output of said sixth Flip-Flop 93 and an output connected to the D input of said sixth Flip-Flop 93;

a seventh Flip-Flop 101 having a clock input connected to the output of said fourth inverter 91, a data input, a clear input connected to the Q output of said fourth Flip-Flop 109 and a Q output;

a fifth inverter 95 having an input connected to the Q output of said seventh Flip-Flop 101 and an output connected to the D input of said seventh Flip-Flop 101;

a NAND gate 103 having a first input connected to the Q output of said fifth Flip-Flop 89, a second input connected to the Q output of said sixth Flip-Flop 93, a third input connected to the Q output of said seventh Flip-Flop 101 and an output; and a third AND gate 107 having a first input connected to the output of said NAND gate 103, a second input for receiving said clear signal and an output connected to the clear input of said fourth Flip-Flop 109.

10. A dithered analog-to-digital conversion circuit with gain control, comprising:

an analog to digital converter having an input for receiving an analog video signal, said analog to digital converter converting said analog video signal to an equivalent digital signal having a plurality of digital data samples, each of said digital data samples having thirteen data bits and a sign bit;

said analog to digital converter generating a frame start signal;

serial to parallel conversion means for receiving said digital equivalent signal and converting said digital equivalent signal from a serial form to a parallel form;

first programmed memory means for digitally generating a sequence of dither components;

second programmed memory means for digitally generating a first logic signal and a word length control signal;

decoder means for receiving said first logic signal and decoding said first logic signal to provide a second logic signal;

clock signal generating means for receiving a system clock signal and said frame start signal, said clock signal generating means, responsive to said system clock signal and said frame start signal, generating a strobe data in signal and an internal clock signal;

a down counter coupled to said decoder means and said clock signal generating means for receiving said internal clock signal and said second logic signal, said down counter, responsive to said internal clock signal, counting down from a first binary number set within said down counter when said down counter receives and decodes said second logic signal;

said down counter providing a latch pulse when said binary counter counts down from said first binary number to a second binary number preset within said down counter;

latching means having a data input for receiving a logic one signal, a clock input connected to said down counter for receiving said logic pulse and an output, said latching means, responsive to said latch pulse, latching to the output of said latching means said logic one signal;

gating means having a first input for receiving said logic one signal, a second input for receiving said data strobe in signal, and an output, said logic one signal enabling said gating means allowing said data strobe in signal to pass through said gating means to provide at the output of said gating means a data strobe out signal;

a first-in, first-out memory coupled to said serial to parallel conversion means, said clock signal generating means and the output of said gating means, said first-in, first-out memory, responsive to said data strobe in signal, temporarily storing the digital data samples of said digital equivalent signal;

said first-in, first-out memory receiving said data strobe out signal from said gating means, said data strobe out signal effecting a retrieval of the digital data samples of said digital equivalent signal stored in said first-in, first-out memory;

gain control circuit means for receiving first, second, third, fourth, fifth, sixth, and seventh most significant data bits of said digital data samples and said sign bit for each of said digital data samples;

said gain control circuit means calculating an average value of said first, second, third, fourth, fifth, sixth, and seventh most significant bits for a predetermined number of digital data samples, said gain control circuit means generating a word length control signal indicative of said average value, said gain control circuit means factoring in the sign bit of each digital data sample when calculating said average value for said predetermined number of digital data samples;

said gain control circuit means receiving said latch pulse and being reset by said latch pulse to allow for subsequent average value calculations of said predetermined number of digital data samples; and a data selector circuit coupled to an output of said first-in, first-out memory for receiving the thirteen data bits of said digital data samples from said first-in, first-out memory;

said data selector circuit coupled to an output of said gain control circuit means for receiving said word length control signal from said gain control circuit means, said data circuit means, responsive to said word length control signal selecting an optimum number of data bits of the thirteen data bits of each digital data sample to maximize digital video information being provided by said dithered analog-to-digital conversion circuit;

said data selector circuit providing said optimum number of data bits of each digital data sample selected by said data selector circuit to an output of said data selector circuit;

binary adder means coupled to the output of said data selector circuit for receiving the optimum number of data bits of each digital data sample;

said binary adder means being coupled to the output of said gating means for receiving said data strobe out signal, said data strobe out signal effecting an addition of the optimum number of data bits of each digital data sample to one of said sequence of dither components to provide a digital output signal; and a gain encoder circuit coupled to said gain control circuit means for receiving said word length control signal;

said gain encoder circuit encoding said word length control signal to provide a three bit logic signal indicative of the optimum number of data bits of each digital data sample selected by said data selector signal.

11. The dithered analog-to-digital conversion circuit of claim 10 wherein said first and said second programmed memory means each comprise an Electrical Erasable Programmed Read Only Memory.

12. A dithered analog-to-digital conversion circuit with gain control, comprising:

an analog to digital converter having an input for receiving an analog video signal, said analog to digital converter converting said analog video signal to an equivalent digital signal having a plurality of digital data samples, each of said digital data samples having thirteen data bits and a sign bit;

said analog to digital converter generating a frame start signal;

serial to parallel conversion means for receiving said digital equivalent signal and converting said digital equivalent signal from a serial form to a parallel form;

first programmed memory means for digitally generating a sequence of dither components;

second programmed memory means for digitally generating a first logic signal and a word length control signal;

decoder means for receiving a first logic signal and decoding said first logic signal to provide a second logic signal;

clock signal generating means for receiving a system clock signal and a frame start signal, said clock signal generating means, responsive to said system clock signal and said frame start signal, generating a strobe data in signal and an internal clock signal;

a down counter coupled to said decoder means and said clock signal generating means for receiving said internal clock signal and said second logic signal, said down counter, responsive to said internal clock signal, counting down from a first binary number set within said down counter when said down counter receives and decodes said second logic signal;

said down counter providing a latch pulse when said binary counter counts down from said first binary number to a second binary number preset within said down counter;

latching means having a data input for receiving a logic one signal, a clock input connected to said down counter for receiving said logic pulse and an output, said latching means, responsive to said latch pulse, latching to the output of said latching means said logic one signal;

gating means having a first input for receiving said logic one signal, a second input for receiving said data strobe in signal, and an output, said logic one signal enabling said AND gate allowing said data strobe in signal to pass through said gating means to provide at the output of said gating means a data strobe out signal;

a first-in, first-out memory coupled to said serial to parallel conversion means, said clock signal generating means and the output of said gating means, said first-in, first-out memory, responsive to said data strobe in signal, temporarily storing the digital data samples of said digital equivalent signal;

said first-in, first-out memory receiving said data strobe out signal from said gating means, said data strobe out signal effecting a retrieval of the digital data samples of said digital equivalent signal stored in said first-in, first-out memory;

gain control circuit means for receiving first, second, third, fourth, fifth, sixth and seventh data bits of said digital data samples;

said gain control circuit means determining a peak magnitude value of said first, second, third, fourth, fifth, sixth and seventh most significant bits for one digital data sample of a predetermined number of digital data samples, said gain control circuit means generating a word length control signal, said word length control signal being representative of said peak magnitude value of said first, second, third, fourth, fifth, sixth and seventh most significant bits for said one digital data sample;

said gain control circuit means receiving said latch pulse and being reset by said latch pulse to allow for subsequent determinations of said peak magnitude value;

a data selector circuit coupled to an output of said first-in, first-out memory for receiving the thirteen data bits of said digital data samples from said first-in, first-out memory;

said data selector circuit coupled to an output of said gain control circuit means for receiving said word length control signal from said gain control circuit means, said data circuit means, responsive to said word length control signal selecting an optimum number of data bits of the thirteen data bits of each digital data sample to maximize digital video information being provided by said dithered analog-to-digital conversion circuit;

said data selector circuit providing said optimum number of data bits of each digital data sample selected by said data selector circuit to an output of said data selector circuit;

binary adder means coupled to the output of said data selector circuit for receiving the optimum number of data bits of each digital data sample;

said binary adder means being coupled to the output of said gating means for receiving said data strobe out signal, said data strobe out signal effecting an addition of the optimum number of data bits of each digital data sample to one of said sequence of dither components to provide a digital output signal; and a gain encoder circuit coupled to said gain control circuit means for receiving said word length control signal;

said gain encoder circuit encoding said word length control signal to provide a three bit logic signal indicative of the optimum number of data bits of each digital data sample selected by said data selector signal.

13. The dithered analog-to-digital conversion circuit of claim 12 wherein said data selector circuit comprises:

a first inverter 557 having an input for receiving a first bit of said word length control signal and an output;

a second inverter 558 having an input for receiving a second bit of said word length control signal and an output;

a first AND gate 554 having a first input connected to the output of said first inverter 557, a second input for receiving the second bit of said word length control signal and an output;

a second AND gate 555 having a first input connected to the output of said second inverter 558, a second input for the first bit of said word length control signal and an output;

a third AND gate 556 having a first input for receiving the first bit of said word length control signal, a second input for receiving the second bit of said word length control signal and an output;

a first OR gate 559 having a first input for receiving a first bit of said gain control signal, a second input connected to the output of said first AND gate 554 and an output;

a second OR gate 560 having a first input for receiving a second bit of said gain control signal, a second input connected to the output of said second AND gate 555 and an output;

a third OR gate 561 having a first input for receiving a third bit of said gain control signal, a second input connected to the output of said third AND gate 556 and an output;

a first bit selector circuit 562 having eight data inputs for receiving a first selected group of eight data bits of each of said digital data samples, first, second, third and fourth select inputs for respectively receiving fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a second bit selector circuit 563 having eight data inputs for receiving a second selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a third bit selector circuit 564 having eight data inputs for receiving a third selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a fourth bit selector circuit 565 having eight data inputs for receiving a fourth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a fifth bit selector circuit 566 having eight data inputs for receiving a fifth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a sixth bit selector circuit 567 having eight data inputs for receiving a sixth selected group of eight data bits of each of said digital data samples, first, second, third and fourth select inputs for respectively receiving said fourth, fifth, sixth and seventh bits of said gain control signal, a fifth select input connected to the output of said first OR gate 559, a sixth select input connected to the output of said second OR gate 560, a seventh select input connected to the output of said third OR gate 561, and an output connected to said binary adder means;

a seventh bit selector circuit 568 having seven data inputs for receiving a seventh selected group of seven data bits of each of said digital data samples, first, second, third and fourth select inputs for respectively receiving said fourth, fifth, sixth and seventh bits of said gain control signal, a fifth select input connected to the output of said second OR gate 560, a sixth select input connected to the output of said third OR gate 561, and an output connected to said binary adder means;

a eighth bit selector circuit 569 having six data inputs for receiving an eighth selected group of six data bits of each of said digital data samples, first, second, third and fourth select inputs for respectively receiving said fourth, fifth, sixth and seventh bits of said gain control signal, a fifth select input connected to the output of said third OR gate 561, and an output connected to said binary adder means; and a ninth bit selector circuit 570 having five data inputs for receiving a ninth selected group of five data bits of each of said digital data samples, first, second, third and fourth select inputs for respectively receiving said fourth, fifth, sixth and seventh bits of said gain control signal, and an output connected to said binary adder means.

14. The dithered analog-to-digital conversion circuit of claim 12 wherein said first and said second programmed memory means each comprise an Electrical Erasable Programmed Read Only Memory.

15. The dithered analog-to-digital conversion circuit of claim 12 wherein said latching means comprises a D Flip-Flop.

16. The dithered analog-to-digital conversion circuit of claim 12 wherein said gating means comprises a two input AND gate.

17. The dithered analog-to-digital conversion circuit of claim 12 further comprising a binary counter connected to said first programmed memory means and said second programmed memory means for providing addressing to said first programmed memory means and said second programmed memory means.

18. The dithered analog-to-digital conversion circuit of claim 12 wherein said serial to parallel conversion means comprises a fourteen bit serial to parallel converter.

19. The dithered analog-to-digital conversion circuit of claim 12 wherein said decoder means comprises:

a first inverter 55 having an input for receiving a first bit of said first logic signal and an output;

a second inverter 57 having an input for receiving a second bit of said first logic signal and an output;

a third inverter 59 having an input for receiving a third bit of said first logic signal and an output;

a first AND gate 61 having a first input for receiving said first bit of said first logic signal, a second input connected to the output of said second inverter 57, a third input for receiving said third bit of said first logic signal and an output connected to said down counter and said gain control circuit means;

a second AND gate 63 having a first input for receiving said first bit of said first logic signal, a second input connected to the output of said second inverter 57, a third input connected to the output of said third inverter 59 and an output connected to said down counter and said gain control circuit means;

a third AND gate 65 having a first input connected to the output of said first inverter 55, a second input for receiving the second bit of said first logic signal, a third input for receiving the third bit of said first logic signal and an output connected to said down counter and said gain control circuit means;

a fourth AND gate 65 having a first input connected to the output of said first inverter 55, a second input for receiving the second bit of said first logic signal, a third input connected to the output of said third inverter 59 and an output connected to said down counter and said gain control circuit means; and a fifth AND gate 65 having a first input connected to the output of said first inverter 55, a second input connected to the output of said second inverter 57, a third input for receiving the third bit of said first logic signal and an output connected to said down counter and said gain control circuit means.

20. The dithered analog-to-digital conversion circuit of claim 12 wherein said clock signal generating means comprises:

a first Flip-Flop 85 having a clock input for receiving said frame start signal, a data input for receiving said logic one signal, a clear input for receiving a clear signal and a Q output;

a second Flip-Flop 77 having a clock input for receiving said frame start signal, a data input connected to the Q output of said first Flip-Flop 85, a clear input and a Q output;

a first inverter 75 having an input for receiving said system clock signal and an output;

a third Flip-Flop 79 having a clock input connected to the output of said first inverter 75, a data input connected to the Q output of said second Flip-Flop 77, a clear input for receiving said clear signal and a Q output;

a first AND gate 73 having a first input for receiving said system clock signal, a second input connected to the Q output of said third Flip-Flop 79 and an output for providing said strobe data in signal;

a second inverter 81 having an input connected to the Q output of said third Flip-Flop 79 and an output;

a second AND gate 73 having a first input connected to the output of said second inverter 81, a second input for receiving said clear signal and an output connected to the clear input of said second Flip-Flop 77;

an OR gate 105 having a first input connected to the output of said second AND gate 73, a second input and an output for providing said internal clock signal;

a fourth Flip-Flop 109 having a clock input connected to the output of said OR gate 109, a data input for receiving said logic one signal, a clear input and a Q output connected to the second input of said OR gate 105;

a fifth Flip-Flop 89 having a clock input for receiving said system clock signal, a data input, a clear input connected to the Q output of said fourth Flip-Flop 109 and a Q output;

a third inverter 87 having an input connected to the Q output of said fifth Flip-Flop 89 and an output connected to the D input of said fifth Flip-Flop 89;

a sixth Flip-Flop 93 having a clock input connected to the output of said third inverter 87, a data input, a clear input connected to the Q output of said fourth Flip-Flop 109 and a Q output;

a fourth inverter 91 having an input connected to the Q output of said sixth Flip-Flop 93 and an output connected to the D input of said sixth Flip-Flop 93;

a seventh Flip-Flop 101 having a clock input connected to the output of said fourth inverter 91, a data input, a clear input connected to the Q output of said fourth Flip-Flop 109 and a Q output;

a fifth inverter 95 having an input connected to the Q output of said seventh Flip-Flop 101 and an output connected to the D input of said seventh Flip-Flop 101;

a NAND gate 103 having a first input connected to the Q output of said fifth Flip-Flop 89, a second input connected to the Q output of said sixth Flip-Flop 93, a third input connected to the Q output of said seventh Flip-Flop 101 and an output; and a third AND gate 107 having a first input connected to the output of said NAND gate 103, a second input for receiving said clear signal and an output connected to the clear input of said fourth Flip-Flop 109.

\* \* \* \* \*